United States Patent
Onishi

(10) Patent No.: US 6,841,409 B2
(45) Date of Patent: Jan. 11, 2005

(54) GROUP III-V COMPOUND SEMICONDUCTOR AND GROUP III-V COMPOUND SEMICONDUCTOR DEVICE USING THE SAME

(75) Inventor: Toshikazu Onishi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/342,321

(22) Filed: Jan. 15, 2003

(65) Prior Publication Data

US 2003/0146444 A1 Aug. 7, 2003

(30) Foreign Application Priority Data

Jan. 17, 2002 (JP) .................................. 2002-008252
Feb. 25, 2002 (JP) .................................. 2002-047436
Jun. 28, 2002 (JP) .................................. 2002-189132

(51) Int. Cl.$^7$ ...................... H01L 27/15; H01L 29/12
(52) U.S. Cl. ...................... 438/37; 257/79; 257/615; 257/190; 257/191; 257/613; 257/631; 257/189; 257/200; 372/43

(58) Field of Search .................... 257/615, 79, 190, 257/191, 613, 631, 189, 200; 438/37; 372/43

(56) References Cited

U.S. PATENT DOCUMENTS 5,744,829 A * 4/1998 Murasato et al. ............. 257/94
6,181,721 B1 * 1/2001 Geels et al. ................... 372/45
6,449,299 B1 * 9/2002 Sato ............................. 372/45

* cited by examiner

Primary Examiner—Jerome Jackson
Assistant Examiner—Joseph Nguyen
(74) Attorney, Agent, or Firm—McDermott Will & Emery LLP

(57) ABSTRACT

An AlGaInP layer is formed on a substrate made of GaAs, and an AlGaAs layer is formed on the AlGaInP layer via a buffer layer therebetween. The buffer layer has a thickness of about 1.1 nm and is made of AlGaInP whose Ga content is smaller than that of the AlGaInP layer. The buffer layer may alternatively be made of AlGaAs whose Al content is smaller than that of the AlGaAs layer.

10 Claims, 23 Drawing Sheets

US 6,841,409 B2

GROUP III-V COMPOUND SEMICONDUCTOR AND GROUP III-V COMPOUND SEMICONDUCTOR DEVICE USING THE SAME

BACKGROUND OF THE INVENTION

A group III-V compound semiconductor is widely used as a material of various semiconductor elements such as a light emitting element, e.g., a semiconductor laser diode (LD) and a light emitting diode (LED), and a logic circuit element, e.g., a field effect transistor (FET) and a heterojunction bipolar transistor (HBT). In these devices, a plurality of semiconductor layers having different mixed crystal compositions are layered together to realize intended optical and electrical characteristics.

A semiconductor device made of such a group III-V compound semiconductor requires a thickness control on the nanometer order and an interface steepness, and is thus typically manufactured by using a metal organic vapor phase epitaxy (MOVPE) method or a molecular beam epitaxy (MBE) method.

Particularly, $Al_xGa_yIn_{1-x-y}P$ (where $0 \leq x \leq 1$, $0 \leq y \leq 1$, $0 \leq x+y \leq 1$) and $Al_zGa_{1-z}As$ (where $0 \leq z \leq 1$), which have band gaps corresponding to the visible region and the infrared region, respectively, are important semiconductor materials of light emitting elements. Furthermore, the band gaps can be varied over a wide range by varying the respective Al contents, and the electrical and optical characteristics of a semiconductor device using these materials can be variously adjusted by combining an AlGaInP layer and an AlGaAs layer. In this way, it is possible to realize a high-performance semiconductor device having a new function. Thus, the development of a group III-V compound semiconductor including an AlGaInP layer in combination with an AlGaAs layer is very important.

In view of this, the present inventor produced a group III-V compound semiconductor as illustrated in FIG. 25 by using an MOVPE method. As illustrated in FIG. 25, the group III-V compound semiconductor produced by the present inventor includes an AlGaInP layer 202 made of $Al_{0.35}Ga_{0.15}In_{0.5}P$ having a thickness of about 0.2 µm and an AlGaAs layer 203 made of $Al_{0.6}Ga_{0.4}As$ having a thickness of about 0.3 µm, which are deposited in this order on a substrate 201 made of GaAs.

However, the group III-V compound semiconductor is observed, with human eyes, to be cloudy across the entire surface thereof, indicating occurrence of crystal defects. Further microscopic observation reveals that there are a large number of crystal defects having a diameter of about 1 µm with a density of $1.4 \times 10^5/cm^2$. This is three to four orders of magnitude greater than the value obtained when only one layer of the AlGaInP layer 202 or the AlGaAs layer 203 is formed on the substrate 201 made of GaAs. This suggests that the occurrence of the crystal defects is due to the interface between the AlGaInP layer 202 and the AlGaAs layer 203.

Moreover, when the AlGaAs layer 203 is formed on the substrate 201, and the AlGaInP layer 202 is formed on the AlGaAs layer 203, such crystal defects are hardly observed. This suggests that the crystal defects are characteristic of a structure where the AlGaAs layer 203 is formed on the AlGaInP layer 202.

The crystal defects occur due to the fact that among interactions between an element of the AlGaInP layer 202 and an element of the AlGaAs layer 203, the interaction between the GaP component and the AlAs component is stronger than interactions between other elements or between atoms.

Specifically, in the step of growing the AlGaAs layer 203 on the AlGaInP layer 202 after the AlGaInP layer 202 is formed on the substrate 201, sufficient migration of the AlAs component in the AlGaAs layer 203 being grown is inhibited by the interaction between the AlAs component with the GaP component of the AlGaInP layer 202, thereby disturbing the atomic arrangement at the interface between the AlGaInP layer 202 and the AlGaAs layer 203.

As described above, when a group III-V compound semiconductor is produced in which an AlGaAs layer is deposited on an AlGaInP layer, a large number of crystal defects occur. Therefore, it is difficult to realize a group III-V compound semiconductor, or a group III-V compound semiconductor device using the same, in which an AlGaAs layer is deposited on an AlGaInP layer.

SUMMARY OF THE INVENTION

The present invention has been made in order to solve the problems in the prior art, and has an object to provide a group III-V compound semiconductor device including an AlGaInP layer and an AlGaAs layer formed on the AlGaInP layer, in which the crystal defect density at the interface between the AlGaInP layer and the AlGaAs layer is reduced.

In order to achieve the object set forth above, a first method for manufacturing a group III-V compound semiconductor device of the present invention includes: a first step of forming a first semiconductor layer made of $Al_aGa_bIn_{1-a-b}P$ (where $0 \leq a \leq 1$, $0 \leq b \leq 1$, $0 \leq a+b \leq 1$); and a second step of forming a second semiconductor layer made of $Al_cGa_{1-c}As$ (where $0 \leq c \leq 1$) on the first semiconductor layer, wherein in the first step, a Ga content b of the first semiconductor layer is small.

In the first method for manufacturing a group III-V compound semiconductor device of the present invention, the first semiconductor layer has a small Ga content, whereby when the second semiconductor layer made of AlGaAs is formed on the first semiconductor layer made of AlGaInP, the crystal defect density at the interface between the first semiconductor layer and the second semiconductor layer can be reduced, as compared to a case where the Ga content of the first semiconductor layer is relatively large, for the following reason. During the growth of the second semiconductor layer on the first semiconductor layer, the interaction between the GaP component in the first semiconductor layer and the AlAs component in the second semiconductor layer is reduced, thereby facilitating the migration of the AlAs component in the second semiconductor layer being formed.

In the first method for manufacturing a group III-V compound semiconductor device, it is preferred that the Ga content b in the first semiconductor layer is 0.35 or less.

In this way, it is possible to reliably reduce the crystal defect density at the interface between the first semiconductor layer and the second semiconductor layer.

A first group III-V compound semiconductor device of the present invention includes: a first semiconductor layer made of $Al_aGa_bIn_{1-a-b}P$ (where $0 \leq a \leq 1$, $0 \leq b \leq 1$, $5$ $0 \leq a+b \leq 1$); and a second semiconductor layer made of $Al_cGa_{1-c}As$ (where $0 \leq c \leq 1$) formed on the first semiconductor layer, wherein a Ga content b in the first semiconductor layer is 0.35 or less.

The first group III-V compound semiconductor device of the present invention includes a layered structure of the first semiconductor layer made of AlGaInP and the second semiconductor layer made of AlGaAs, in which the Ga content in the first semiconductor layer is 0.35 or less. Therefore, it is possible to reliably reduce the crystal defect density at the interface between the first semiconductor layer and the second semiconductor layer. Thus, it is possible to improve the performance of a group III-V compound semiconductor device that uses a first semiconductor layer and a second semiconductor layer.

It is preferred that the first group III-V compound semiconductor device further includes: a first cladding layer made of a compound semiconductor of a first conductivity type formed on a substrate; an active layer formed on the first cladding layer; and a second cladding layer made of a compound semiconductor of a second conductivity type formed on the active layer, wherein the first semiconductor layer is formed in a stripe shape on the second cladding layer.

In this way, in a case where an active layer is designed so that light is distributed also above a cladding layer in a semiconductor laser device in which the second cladding layer and the first semiconductor layer are used each as a cladding layer of the second conductivity type while the second semiconductor layer is used as a part of a contact layer between the second cladding layer and an electrode, the crystal defect density does not increase even if the Al content in the second semiconductor layer is increased. Therefore, the absorption of light in the second semiconductor layer is reduced, whereby it is possible to reduce the operating current of the semiconductor laser device.

It is preferred that the first group III-V compound semiconductor device further includes: a first contact layer made of $Al_dGa_{1-d}As$ (where $0 \leq d \leq 1$) of the second conductivity type formed on the second semiconductor layer; and a second contact layer made of GaAs of the second conductivity type formed on the first contact layer, wherein an Al content d in the first contact layer is larger than an Al content c in the second semiconductor layer.

In this way, the band offset of the valence band between the second contact layer and the second semiconductor layer is reduced by the first contact layer, whereby it is possible to reduce the operating voltage of the semiconductor laser device.

It is preferred that the first group III-V compound semiconductor device further includes: a first cladding layer made of a compound semiconductor of a first conductivity type formed on a substrate; an active layer formed on the first cladding layer; and a second cladding layer made of a compound semiconductor of a second conductivity type formed on the active layer, wherein: the first semiconductor layer is provided on the second cladding layer; and the second semiconductor layer is formed in a stripe shape.

In this way, in a semiconductor laser device in which the second cladding layer and the second semiconductor layer are used each as a cladding layer of the second conductivity type while the first semiconductor layer is used as an etching stop layer for forming the second semiconductor layer in a stripe shape, the second semiconductor layer is made of AlGaAs, which has a high thermal conductivity, whereby it is possible to improve the property of radiating heat that is generated in the active layer and to increase the output power of the group III-V compound semiconductor device. Moreover, the first semiconductor layer has a relatively small Ga content, whereby it is possible to form the second semiconductor layer with a reduced crystal defect density. Therefore, it is possible to reliably obtain a group III-V compound semiconductor device having a high output power and a high reliability.

In the first group III-V compound semiconductor device, it is preferred that the second cladding layer is made of $Al_dGa_{1-d}As$ (where $0 \leq d \leq 1$) of the second conductivity type.

In this way, in addition to the second semiconductor layer, the second cladding layer is also made of AlGaAs, which has a high thermal conductivity, whereby it is possible to further improve the property of radiating heat that is generated in the active layer and to further increase the output power of the group III-V compound semiconductor device.

In the first group III-V compound semiconductor device, it is preferred that the first cladding layer is made of $Al_dGa_{1-d}As$ (where $0 \leq d \leq 1$) of the first conductivity type.

In this way, in addition to the second semiconductor layer, the first cladding layer is also made of AlGaAs, which has a high thermal conductivity, whereby it is possible to further improve the property of radiating heat that is generated in the active layer and to further increase the output power of the group III-V compound semiconductor device.

It is preferred that the first group III-V compound semiconductor device further includes: a first cladding layer made of a compound semiconductor of a first conductivity type formed on a substrate; and an active layer formed on the first cladding layer, wherein the first semiconductor layer is provided on the active layer.

In this way, in a semiconductor laser device in which the first semiconductor layer and the second semiconductor layer are used each as a cladding layer of the second conductivity type, the second semiconductor layer is made of AlGaAs, which has a high thermal conductivity, whereby it is possible to improve the property of radiating heat that is generated in the active layer. Moreover, the first semiconductor layer is made of AlGaInP, whereby it is possible to ensure sufficient band gap difference with respect to the active layer, and thus to suppress the overflow of carriers from the active layer. Moreover, since the first semiconductor layer has a relatively small Ga content, the second semiconductor layer can be formed with a reduced crystal defect density, whereby it is possible to reliably obtain a group III-V compound semiconductor device having a high performance and a high reliability.

A second group III-V compound semiconductor device of the present invention includes: a first semiconductor layer made of $Al_aGa_bIn_{1-a-b}P$ (where $0 \leq a \leq 1$, $0 \leq b \leq 1$, $0 \leq a+b \leq 1$); a buffer layer made of $Al_xGa_yIn_{1-x-y}P$ (where $0 \leq x \leq 1$, $0 \leq y \leq 1$, $0 \leq x+y \leq 1$) formed on the first semiconductor layer; and a second semiconductor layer made of $Al_cGa_{1-c}As$ (where $0 \leq c \leq 1$) formed on the buffer layer, wherein a Ga content y in the buffer layer is smaller than a Ga content b in the first semiconductor layer.

In the second group III-V compound semiconductor device of the present invention, the Ga content in the buffer layer is smaller than that in the first semiconductor layer, whereby the crystal defect density at the interface between the second semiconductor layer and the buffer layer can be reduced as compared to a group III-V compound semiconductor device in which the first semiconductor layer and the second semiconductor layer are in direct contact with each other. Thus, it is possible to improve the performance of a group III-V compound semiconductor device that uses a first semiconductor layer and a second semiconductor layer.

It is preferred that the second group III-V compound semiconductor device further includes: a first cladding layer made of a compound semiconductor of a first conductivity type formed on a substrate; an active layer formed on the first cladding layer; and a second cladding layer made of a compound semiconductor of a second conductivity type formed on the active layer, wherein: the active layer is a layered structure including a plurality of semiconductor layers; the first semiconductor layer is provided so as to form an uppermost layer of the active layer; and the second semiconductor layer is provided under the second cladding layer.

In this way, in a semiconductor laser device in which the first semiconductor layer is used as an optical guiding layer of the active layer, even if the impurity concentration of the cladding layer is increased, the impurity is prevented by the second semiconductor layer from diffusing into the active layer. In addition, the second semiconductor layer can be formed with a reduced crystal defect density, whereby it is possible to reliably obtain a semiconductor laser device with a desirable temperature characteristic.

It is preferred that the second group III-V compound semiconductor device further includes: a first cladding layer made of a compound semiconductor of a first conductivity type formed on a substrate; an active layer formed on the first cladding layer; and a second cladding layer made of a compound semiconductor of a second conductivity type formed on the active layer, wherein the first semiconductor layer is provided in a stripe shape on the second cladding layer.

In this way, in a case where an active layer is designed so that light is distributed also above a cladding layer in a semiconductor laser device in which the second cladding layer and the first semiconductor layer are used each as a cladding layer of the second conductivity type while the second semiconductor layer is used as a part of a contact layer between the second cladding layer and an electrode, the crystal defect density does not increase even if the Al content in the second semiconductor layer is increased. Therefore, the absorption of light in the second semiconductor layer is reduced, whereby it is possible to reduce the operating current of the semiconductor laser device.

It is preferred that the second group III-V compound semiconductor device further includes: a first contact layer made of $Al_dGa_{1-d}As$ (where $0 \leq d \leq 1$) of the second conductivity type formed on the second semiconductor layer; and a second contact layer made of GaAs of the second conductivity type formed on the first contact layer, wherein an Al content d in the first contact layer is larger than an Al content c in the second semiconductor layer.

In this way, the band offset of the valence band between the second contact layer and the second semiconductor layer is reduced by the first contact layer, whereby it is possible to reduce the operating-voltage of the semiconductor laser device.

It is preferred that the second group III-V compound semiconductor device further includes: a first cladding layer made of a compound semiconductor of a first conductivity type formed on a substrate; an active layer formed on the first cladding layer; and a second cladding layer made of a compound semiconductor of the second conductivity type formed in a stripe shape on the active layer, wherein the first semiconductor layer is provided on the second cladding layer.

In this way, in a semiconductor laser device in which the first semiconductor layer and the second semiconductor layer are used each as a contact layer between the second cladding layer and an electrode, the band offset of the valence band between the second cladding layer and the second semiconductor layer is reduced by the first semiconductor layer, thereby reducing the operating voltage of the semiconductor laser device. Furthermore, the second semiconductor layer having a large Al content can be formed with a reduced crystal defect density, whereby it is possible to suppress the absorption of light emitted from the active layer by the second semiconductor layer.

It is preferred that the second group III-V compound semiconductor device further includes: a first cladding layer made of a compound semiconductor of a first conductivity type formed on a substrate; and an active layer formed on the first cladding layer, wherein the first semiconductor layer is provided on the active layer.

In this way, in a semiconductor laser device in which the first semiconductor layer is used as a cladding layer of the second conductivity type, the second semiconductor layer made of AlGaAs can be formed on the cladding layer with a reduced crystal defect density.

In the second group III-V compound semiconductor device, it is preferred that: the first semiconductor layer includes a stripe-shaped protrusion; the buffer layer is provided at a foot of the protrusion and on a side surface of the protrusion; and the second semiconductor layer contains an impurity of the first conductivity type and is provided with an opening corresponding to a top surface of the protrusion so that the second semiconductor layer covers the buffer layer except for an area over the top surface of the protrusion.

In this way, the second semiconductor layer can be used as a current blocking layer. Thus, AlGaAs, which has a large band gap, can be used for the current blocking layer, whereby it is possible to reduce the loss of light in the current blocking layer.

In the second group III-V compound semiconductor device of the present invention, it is preferred that the buffer layer contains an impurity of the first conductivity type.

In this way, the buffer layer can be used as a part of a current blocking layer.

In the second group III-V compound semiconductor device, it is preferred that the buffer layer is provided on the first semiconductor layer so as to cover the first semiconductor layer including the top surface of the protrusion.

In the second group III-V compound semiconductor device, it is preferred that the buffer layer contains an impurity of the second conductivity type.

In this way, the buffer layer can be used as a part of a cladding layer of the second conductivity type.

It is preferred that the second group III-V compound semiconductor device further includes: a first cladding layer made of a compound semiconductor of a first conductivity type formed on a substrate; an active layer formed on the first cladding layer; and a second cladding layer made of a compound semiconductor of a second conductivity type formed on the active layer, wherein: the first semiconductor layer includes a stripe-shaped opening and contains an impurity of the first conductivity type; and the buffer layer is provided on a wall surface of the opening in the first semiconductor layer and on an upper surface of the first semiconductor layer.

In this way, in a semiconductor laser device in which the first semiconductor layer is used as a current blocking layer while the second semiconductor layer is used as a cladding layer of the second conductivity type, the Al content in the second semiconductor layer can be increased to reduce the loss of light in the cladding layer while reducing the crystal defect density in the second semiconductor layer.

It is preferred that the second group III-V compound semiconductor device further includes: a first cladding layer made of a compound semiconductor of a first conductivity type formed on a substrate; and an active layer formed on the first cladding layer, wherein: the active layer is a layered structure including a plurality of semiconductor layers; and the first semiconductor layer is provided so as to form an uppermost layer of the active layer.

In this way, in a semiconductor laser device in which the first semiconductor layer is used as an optical guiding layer of the active layer while the second semiconductor layer is used as a cladding layer of the second conductivity type, it is possible to improve the thermal conductivity of the cladding layer of the second conductivity type so as to improve the property of radiating heat that is generated in the active layer, and thus to increase the output power of the group III-V compound semiconductor device.

It is preferred that the second group III-V compound semiconductor device further includes: an etching stop layer made of $Al_dGa_eIn_{1-d-e}P$ (where $0 \leq d \leq 1$, $0 \leq e \leq 1$, $0 \leq d+e \leq 1$) formed on the second semiconductor layer; and a second cladding layer made of $Al_fGa_{1-f}As$ (where $0 \leq f \leq 1$) of a second conductivity type formed on the etching stop layer, wherein a Ga content e in the etching stop layer is 0.35 or less.

In this way, the heat radiating property can be improved by using the second semiconductor layer and the second cladding layer each as a cladding layer of the second conductivity type. In addition, the second cladding layer can be processed with a high precision and with a reduced crystal defect density by using the etching stop layer.

It is preferred that the second group III-V compound semiconductor device further includes: an etching stop layer made of $Al_dGa_eIn_{1-d-e}P$ (where $0 \leq d \leq 1$, $0 \leq e \leq 1$, $0 \leq d+e \leq 1$) formed on the second semiconductor layer; a third semiconductor layer made of $Al_fGa_gIn_{1-f-g}P$ (where $0 \leq f \leq 1$, $0 \leq g \leq 1$, $0 \leq f+g \leq 1$) formed on the etching stop layer; and a second cladding layer made of $Al_hGa_{1-h}As$ (where $0 \leq h \leq 1$) of a second conductivity type formed on the third semiconductor layer, wherein a Ga content g in the third semiconductor layer is smaller than a Ga content e in the etching stop layer.

In this way, the second cladding layer can be formed with a reduced crystal defect density by using the third semiconductor layer as a buffer layer. Therefore, it is possible to obtain a group III-V compound semiconductor device with a reduced crystal defect density by reducing the Al content in the etching stop layer so as to prevent the etching stop layer from being oxidized during the manufacturing process.

In the second semiconductor laser device, it is preferred that the first cladding layer is made of $Al_dGa_{1-d}As$ (where $0 \leq d \leq 1$).

In this way, the thermal conductivity can be increased also in the cladding layer of the first conductivity type, in addition to the cladding layer of the second conductivity type, thereby further improving the heat radiating property.

It is preferred that the second group III-V compound semiconductor device further includes: a first cladding layer made of a compound semiconductor of a first conductivity type formed on a substrate; and an active layer formed on the first cladding layer, wherein the first semiconductor layer is formed on the active layer.

In this way, the first semiconductor layer and the second semiconductor layer can be formed, with a reduced crystal defect density, each as a cladding layer of the second conductivity type. Therefore, the property of radiating heat that is generated in the active layer can be improved by the second semiconductor layer that is made of AlGaAs, which has a high thermal conductivity. Moreover, the overflow of carriers from the active layer can be suppressed by the first semiconductor layer made of AlGaInP, which has a large band gap.

It is preferred that the second group III-V compound semiconductor device further includes: a first cladding layer made of a compound semiconductor of a first conductivity type formed on a substrate; an active layer formed on the first cladding layer; and a second cladding layer made of $Al_dGa_eIn_{1-d-e}P$ (where $0 \leq d \leq 1$, $0 \leq e \leq 1$, $0 \leq d+e \leq 1$) of a second conductivity type formed on the active layer, wherein the first semiconductor layer is formed on the second cladding layer.

In this way, the property of radiating heat that is generated in the active layer can be improved by the second semiconductor layer, while the overflow of carriers from the active layer can be suppressed by the second cladding layer. Furthermore, since the second semiconductor layer can be formed with a reduced crystal defect density by providing the buffer layer, it is possible to reduce the Al content in the etching stop layer so as to prevent the etching stop layer from being oxidized during the manufacturing process, thereby obtaining a group III-V compound semiconductor device with a reduced crystal defect density.

In the second group III-V compound semiconductor device, it is preferred that a Ga content y in the buffer layer is zero.

In this way, the crystal defect density at the interface between the second semiconductor layer and the buffer layer is reduced reliably.

In the second group III-V compound semiconductor device, it is preferred that: the substrate is made of GaAs; an In content $1-a-b$ in the first semiconductor layer satisfies $0.45 \leq 1-a-b \leq 0.55$; and an In content $1-x-y$ in the buffer layer satisfies $0.45 \leq 1-x-y \leq 0.55$.

In this way, the buffer layer is lattice-matched with the substrate, whereby it is possible to reliably obtain a group III-V compound semiconductor device with a reduced crystal defect density.

In the second group III-V compound semiconductor device, it is preferred that a thickness of the buffer layer is 0.5 nm or more and 5 nm or less.

In this way, it is possible to reduce the crystal defect density at the interface between the first semiconductor layer or the second semiconductor layer and the buffer layer while the buffer layer gives substantially no influence on the electrical and optical characteristics of the group III-V compound semiconductor device.

A second method for manufacturing a group III-V compound semiconductor device of the present invention includes: a first step of forming a first semiconductor layer made of $Al_aGa_bIn_{1-a-b}P$ (where $0 \leq a \leq 1$, $0 \leq b \leq 1$, $0 \leq a+b \leq 1$); and a second step of forming a second semiconductor layer made of $Al_cGa_{1-c}As$ (where $0 \leq c \leq 1$) on the first semiconductor layer, wherein in the second step, an Al content c of the second semiconductor layer is small.

In the second method for manufacturing a group III-V compound semiconductor device of the present invention, the second semiconductor layer has a small Al content, whereby when the semiconductor layer made of AlGaAs is formed on the first semiconductor layer made of AlGaInP, the crystal defect density at the interface between the first semiconductor layer and the second semiconductor layer can be reduced, as compared to a case where the Al content of the second semiconductor layer is relatively large, for the following reason. During the growth of the second semiconductor layer on the first semiconductor layer, the interaction between the GaP component in the first semiconductor layer and the AlAs component in the second semiconductor layer is reduced, thereby facilitating the migration of the AlAs component in the second semiconductor layer being formed.

In the second method for manufacturing a group III-V compound semiconductor device, it is preferred that the Al content c in the second semiconductor layer is 0.3 or less.

In this way, the crystal defect density at the interface between the first semiconductor layer and the second semiconductor layer can be reduced reliably.

A third group III-V compound semiconductor device of the present invention includes: a first semiconductor layer made of $Al_aGa_bIn_{1-a-b}P$ (where $0 \leq a \leq 1$, $0 \leq b \leq 1$, $0 \leq a+b \leq 1$); and a second semiconductor layer made of $Al_cGa_{1-c}As$ (where $0 \leq c \leq 1$) formed on the first semiconductor layer, wherein an Al content c in the second semiconductor layer is 0.3 or less.

The third group III-V compound semiconductor device of the present invention includes a layered structure of the first semiconductor layer made of AlGaInP and the second semiconductor layer made of AlGaAs, in which the Al content in the second semiconductor layer is 0.3 or less. Therefore, it is possible to reliably reduce the crystal defect density at the interface between the first semiconductor layer and the second semiconductor layer. Thus, it is possible to improve the performance of a group III-V compound semiconductor device that uses a first semiconductor layer and a second semiconductor layer.

A fourth group III-V compound semiconductor device of the present invention includes: a first semiconductor layer made of $Al_aGa_bIn_{1-a-b}P$ (where $0 \leq a \leq 1$, $0 \leq b \leq 1$, $0 \leq a+b \leq 1$); a buffer layer made of $Al_zGa_{1-z}As$ (where $0 \leq z \leq 1$) formed on the first semiconductor layer; and a second semiconductor layer made of $Al_cGa_{1-c}As$ (where $0 \leq c \leq 1$) formed on the buffer layer, wherein an Al content z in the buffer layer is smaller than an Al content c in the second semiconductor layer.

In the fourth group III-V compound semiconductor device of the present invention, the Al content in the buffer layer is smaller than that in the second semiconductor layer, whereby the crystal defect density at the interface between the first semiconductor layer and the buffer layer can be reduced as compared to a group III-V compound semiconductor device in which the first semiconductor layer and the second semiconductor layer are in direct contact with each other. Thus, it is possible to improve the performance of a group III-V compound semiconductor device that uses a first semiconductor layer and a second semiconductor layer.

It is preferred that the fourth group III-V compound semiconductor device further includes an active layer formed on a substrate, the active layer being a layered structure including a plurality of semiconductor layers, wherein: the first semiconductor layer is formed on the substrate; and the second semiconductor layer is provided so as to form a lowermost layer of the active layer.

In this way, in a semiconductor laser device in which the first semiconductor layer is used as a cladding layer of the first conductivity type while the second semiconductor layer is used as an optical guiding layer of the active layer, it is possible to ensure a sufficient band gap difference using a cladding layer of an AlGaInP-based material with an active layer of an AlGaAs-based material. Therefore, it is possible to reliably suppress the overflow of electrons from the active layer into the cladding layer, whereby it is possible to reliably obtain a semiconductor laser device having a reduced threshold current and a desirable temperature characteristic.

In the fourth group III-V compound semiconductor device, it is preferred that an Al content z in the buffer layer is zero.

In this way, the crystal defect density at the interface between the first semiconductor layer and the buffer layer is reduced reliably.

In the fourth group III-V compound semiconductor device, it is preferred that: the substrate is made of GaAs; and an In content $1-a-b$ in the first semiconductor layer satisfies $0.45 \leq 1-a-b \leq 0.55$.

In this way, the first semiconductor layer is lattice-matched with the substrate, whereby it is possible to reliably obtain a group III-V compound semiconductor device with a reduced crystal defect density.

In the fourth group III-V compound semiconductor device, it is preferred that a thickness of the buffer layer is 0.5 nm or more and 5 nm or less.

In this way, it is possible to reduce the crystal defect density at the interface between the first semiconductor layer or the second semiconductor layer and the buffer layer while the buffer layer gives substantially no influence on the electrical and optical characteristics of the group III-V compound semiconductor device.

DETAILED DESCRIPTION OF THE INVENTION

A group III-V compound semiconductor device of the present invention and a method for manufacturing the same will now be described with reference to the drawings. In the following description, "AlGaInP" is defined as "$Al_xGa_yIn_{1-x-y}P$ (where $0 \leq x \leq 1$, $0 \leq y \leq 1$, $0 \leq x+y \leq 1$)", and "AlGaAs" is defined as "$Al_zGa_{1-z}As$ (where $0 \leq z \leq 1$)". Moreover, "GaInP" is used for $Al_xGa_yIn_{1-x-y}P$ where x=0, i.e., $Ga_yIn_{1-y}P$ (where $0 \leq y \leq 1$), and "AlInP" is used for $Al_xGa_yIn_{1-x-y}P$ where y=0, i.e., $Al_xIn_{1-x}P$ (where $0 \leq x \leq 1$).

The present inventor has found that in a layered structure of a group III-V compound semiconductor in which an AlGaAs layer is deposited on an AlGaInP layer, the crystal defect density is reduced as the Ga content of the AlGaInP layer is reduced, or as the Al content of the AlGaAs layer is reduced.

The relationship between the Al content in a group III-V compound semiconductor in which an AlGaAs layer is deposited on an AlGaInP layer and the crystal defect density will now be described with reference to the drawings.

Figure 1:
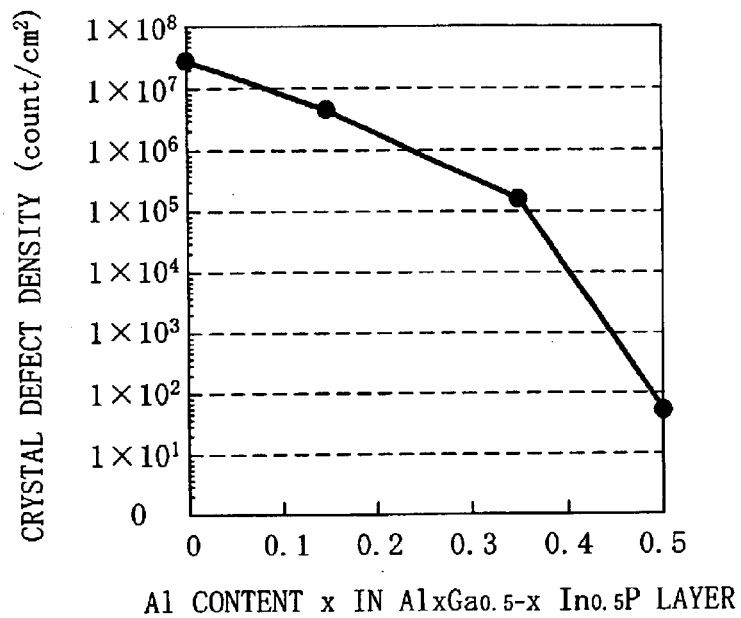
FIG. 1 is a graph illustrating the relationship between the Al content x in an $Al_xGa_{0.5-x}In_{0.5}P$ layer and the crystal defect density for a group III-V compound semiconductor device of the present invention, in which an $Al_{0.6}Ga_{0.4}As$ layer is deposited on the $Al_xGa_{0.5-x}In_{0.5}P$ layer.

FIG. 1 illustrates the relationship between the Al content x in an $Al_xGa_{0.5-x}In_{0.5}P$ layer (where $0 \leq x \leq 0.5$) and the crystal defect density in a case where an $Al_{0.6}Ga_{0.4}As$ layer is formed on the $Al_xGa_{0.5-x}In_{0.5}P$ layer. Herein, "crystal defect density" is defined as the number of crystal defects per unit area that are microscopically observed. Moreover, the In content is set to be 0.5 for the lattice match with a substrate made of GaAs.

As illustrated in FIG. 1, the crystal defect density is smaller as the Al content x in the $Al_xGa_{0.5-x}In_{0.5}P$ layer is larger. Specifically, while the crystal defect density is about $2.7 \times 10^7/cm^2$ where x=0, it is reduced to about $4.0 \times 10^6/cm^2$ where x=0.15, and is further reduced to about $1 \times 10^5/cm^2$ where x=0.35. Furthermore, where x=0.5, hardly any crystal defects are observed, and the number of crystal defects per square centimeter is on the order of 10.

As described above, it can be seen that when an AlGaAs layer is formed on an AlGaInP layer, the crystal defect density is smaller as the Al content in the AlGaInP layer is larger, or as the Ga content is smaller. Specifically, the crystal defect density will be sufficiently small if the Ga content y in the $Al_xGa_yIn_{1-x-y}P$ layer is 0.35 or less.

Note that while FIG. 1 illustrates the crystal defect density in a case where an $Al_{0.6}Ga_{0.4}As$ layer is formed on an $Al_xGa_{0.5-x}In_{0.5}P$ layer, similar results are obtained also when the Al content of the AlGaAs layer formed on the $Al_xGa_{0.5-x}In_{0.5}P$ layer is not 0.6. Thus, the crystal defect density is smaller as the Ga content of the AlGaInP layer is smaller, irrespective of the composition of the AlGaAs layer.

Figure 2:
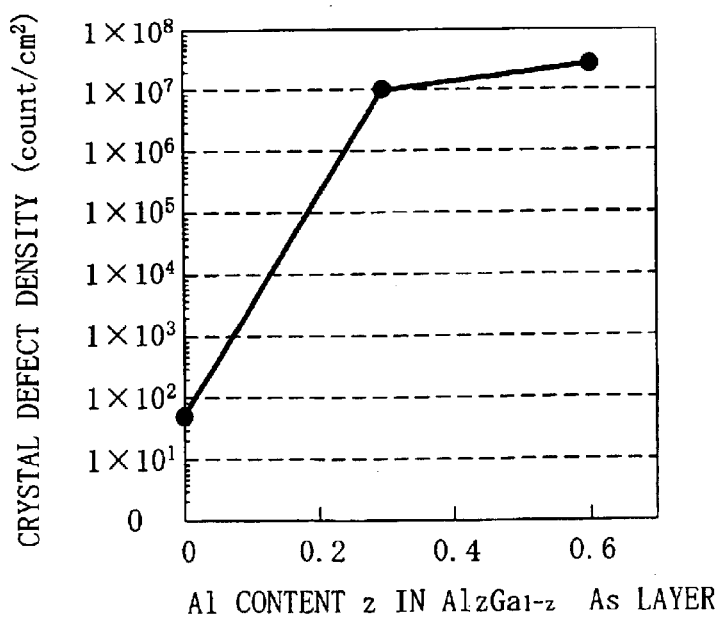
FIG. 2 is a graph illustrating the relationship between the Al content z in an $Al_zGa_{1-z}As$ layer and the crystal defect density for a group III-V compound semiconductor device of the present invention, in which the $Al_zGa_{1-z}As$ layer is formed on a $Ga_{0.5}In_{0.5}P$ layer.

FIG. 2 illustrates the relationship between the Al content z in an $Al_zGa_{1-z}As$ layer (where $0 \leq z \leq 1$) and the crystal defect density in a case where the $Al_zGa_{1-z}As$ layer (where $0 \leq z \leq 1$) is formed on a $Ga_{0.5}In_{0.5}P$ layer.

As illustrated in FIG. 2, the crystal defect density is smaller as the Al content z in the $Al_zGa_{1-z}As$ layer is smaller. Specifically, while the crystal defect density is about $2.7 \times 10^7/cm^2$ where z=0.6, it is reduced by more than 50% to about $1 \times 10^7/cm^2$ where z=0.3. Furthermore, where z=0, hardly any crystal defects are observed, and the number of crystal defects per square centimeter is on the order of 10.

As described above, it can be seen that when an AlGaAs layer is formed on an AlGaInP layer, the crystal defect density is smaller as the Al content in the AlGaAs layer is smaller. Specifically, the crystal defect density will be sufficiently small if the Al content z in the $Al_zGa_{1-z}As$ layer is 0.3 or less.

Note that while FIG. 2 illustrates the crystal defect density in a case where an $Al_xGa_{1-x}As$ layer is formed on an $Ga_{0.5}In_{0.5}P$ layer, similar results are obtained also when the Al content of the AlGaInP layer formed under the $Al_xGa_{1-x}As$ layer is not 0. Thus, the crystal defect density is smaller as the Al content of the AlGaAs layer is smaller, irrespective of the composition of the AlGaInP layer.

As described above, in a group III-V compound semiconductor in which an AlGaAs layer is deposited on an AlGaInP layer, it is possible to reduce the crystal defect density at the interface between the AlGaInP layer and the AlGaAs layer by using an AlGaInP layer having a reduced Ga content or an AlGaAs layer having a reduced Al content.

It is believed that such an effect is obtained due to the fact that among interactions between an element of the AlGaInP layer and an element of the AlGaAs layer, the interaction between the GaP component and the AlAs component is stronger than interactions between other elements or between atoms.

Specifically, in the step of growing the AlGaAs layer on the AlGaInP layer, as the Ga content in the AlGaInP layer is smaller or as the Al content in the AlGaAs layer is smaller, the interaction between the AlAs component and the GaP component is smaller, thereby promoting the migration of the AlAs component in the AlGaAs layer being formed, thus reducing the disturbance in the atomic arrangement at the interface between the AlGaInP layer and the AlGaAs layer.

Based on these findings, in the following embodiments of the present invention, a second semiconductor layer made of AlGaAs is deposited on a first semiconductor layer made of AlGaInP, while reducing the Ga content of the first semiconductor layer or the Al content of the second semiconductor layer at the interface between the first semiconductor layer and the second semiconductor layer, thereby reducing the crystal defect density at the interface between the first semiconductor layer and the second semiconductor layer.
First Embodiment The first embodiment of the present invention will now be described with reference to the drawings.

Figure 3:
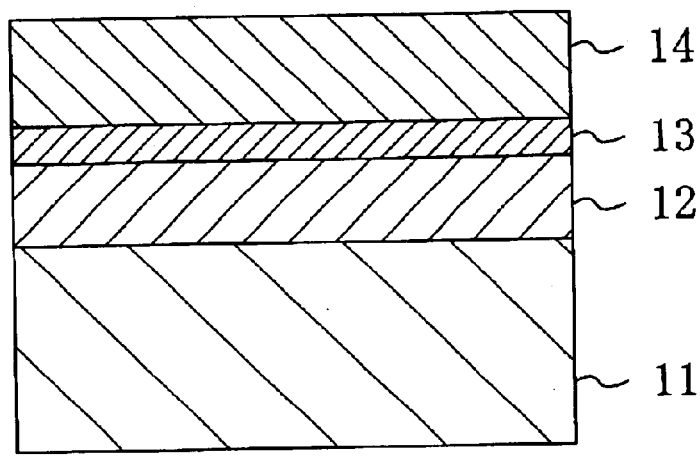
FIG. 3 is a cross-sectional view illustrating a group III-V compound semiconductor layered structure according to a first embodiment of the present invention.

FIG. 3 is a cross-sectional view illustrating a group III-V compound semiconductor layered structure according to the first embodiment. As illustrated in FIG. 3, an AlGaInP layer 12 made of $Al_{0.35}Ga_{0.15}In_{0.5}P$ having a thickness of about 0.2 μm, a buffer layer 13 made of $Al_{0.5}In_{0.5}P$ having a thickness of about 1.1 nm, and an AlGaAs layer 14 made of $Al_{0.6}Ga_{0.4}As$ having a thickness of about 0.3 μm, are deposited in this order on a substrate 11 made of GaAs, for example.

A method for manufacturing the group III-V compound semiconductor layered structure of the first embodiment will now be described.

The group III-V compound semiconductor layered structure of the first embodiment can be formed by successively growing the semiconductor layers on the substrate 11 made of GaAs by using an MOVPE method, for example.

Specifically, triethylgallium (TEG), trimethylaluminum (TMA) and trimethylindium (TMI) are used as group III compound materials, and phosphine ($PH_3$) and arsine ($AsH_3$) are used as group V compound materials. These materials are introduced into a reaction tube made of quartz with hydrogen as a carrier gas. With the pressure inside the reaction tube being about $1.0 \times 10^4$ Pa (about 76 Torr) and the substrate temperature being about 750° C., materials to be supplied and the amount of each material to be supplied are switched from one to another so as to successively grow the semiconductor layers.

A feature of the first embodiment is that the AlGaAs layer 14 is formed on the AlGaInP layer 12 via the buffer layer 13 made of AlGaInP whose Ga content is smaller than that of the AlGaInP layer 12. Thus, instead of depositing the AlGaAs layer 14 directly on the AlGaInP layer 12 made of $Al_{0.35}Ga_{0.15}In_{0.5}P$, the AlGaAs layer 14 is deposited on the buffer layer 13 made of $Al_{0.5}In_{0.5}P$ whose Ga content is smaller than that of the AlGaInP layer 12, thereby reducing the crystal defect density at the interface between the buffer layer 13 and the AlGaAs layer 14.

Furthermore, since the thickness of the buffer layer 13 is as small as about 1.1 nm, the buffer layer 13 does not substantially influence the properties of the group III-V compound semiconductor layered structure such as the optical and electrical characteristics thereof.

Thus, in the group III-V compound semiconductor layered structure of the first embodiment, the buffer layer 13 made of AlGaInP is interposed between the semiconductor layers, whereby it is possible to reduce the crystal defect density from that of a reference layered structure in which the AlGaAs layer 14 is deposited directly on the AlGaInP layer 12, while obtaining substantially the same properties as those of such a reference layered structure.

Herein, the AlGaInP compositions of the AlGaInP layer 12 and the buffer layer 13 are not limited to $Al_{0.35}Ga_{0.15}In_{0.5}P$ and $Al_{0.5}In_{0.5}P$, respectively, but may alternatively be any other suitable compositions as long as the Ga content in the buffer layer 13 is smaller than that in the AlGaInP layer 12. Of course, the effect of reducing the crystal defect density is greater as the Ga content in the buffer layer 13 is smaller.

Moreover, the AlGaAs composition of the AlGaAs layer 14 is not limited to $Al_{0.6}Ga_{0.4}As$, but may alternatively be any other suitable composition defined as $Al_zGa_{1-z}As$ (where $0 \leq z \leq 1$).

Moreover, the thickness of the buffer layer 13 is preferably 0.5 nm or more and 5 nm or less. If it is less than 0.5 nm, the crystal defect density at the interface between the buffer layer 13 and the AlGaAs layer 14 reflects the Al content in the AlGaInP layer 12, and the effect of reducing the crystal defect density by the buffer layer 13 is insufficient. On the other hand, if it is greater than 5 nm, the buffer layer 13 will give a non-negligible influence on the physical properties of the group III-V compound semiconductor layered structure.

In the first embodiment, it is not necessary that the AlGaInP layer 12 is in contact with the buffer layer 13. For example, a semiconductor layer made of AlGaInP whose Ga content is smaller than that of the buffer layer 13 may alternatively be inserted therebetween. Also in such a case, it is only required that the Ga content in the buffer layer 13 is smaller than that in the AlGaInP layer 12.

Moreover, the layered structure including the AlGaInP layer 12, the buffer layer 13 and the AlGaAs layer 14 is not required to be formed on the substrate 11. For example, it may alternatively be formed on another semiconductor layer as a part of a layered structure in a semiconductor device such as a field effect transistor, a heterojunction bipolar transistor, a semiconductor laser device or a light emitting diode.

Moreover, in each of the AlGaInP layer 12 and the buffer layer 13, the In content is set to be 0.5 for the lattice match with the substrate 11 made of GaAs. However, for the purpose of realizing a lattice match with the substrate 11, the In content, 1−x−y, is not limited to 0.5, but may alternatively be any other suitable value as long as it satisfies $0.45 \leq 1-x-y \leq 0.55$. Moreover, if the lattice match with GaAs is not required, the In content, 1−x−y, is only required to satisfy $0 \leq 1-x-y \leq 1$.

As described above, according to the first embodiment, the AlGaAs layer 14 is formed on the AlGaInP layer 12 via the buffer layer 13 made of AlGaInP, and the Ga content in the buffer layer 13 is smaller than that in the AlGaInP layer 12. In this way, it is possible to obtain a group III-V compound semiconductor layered structure in which the crystal defect density is reduced from that of a reference group III-V compound semiconductor layered structure in which the AlGaAs layer 14 is deposited directly on the AlGaInP layer 12, while obtaining substantially the same properties as those of such a reference group III-V compound semiconductor layered structure.
Second Embodiment The second embodiment of the present invention will now be described with reference to the drawings.

Figure 4:
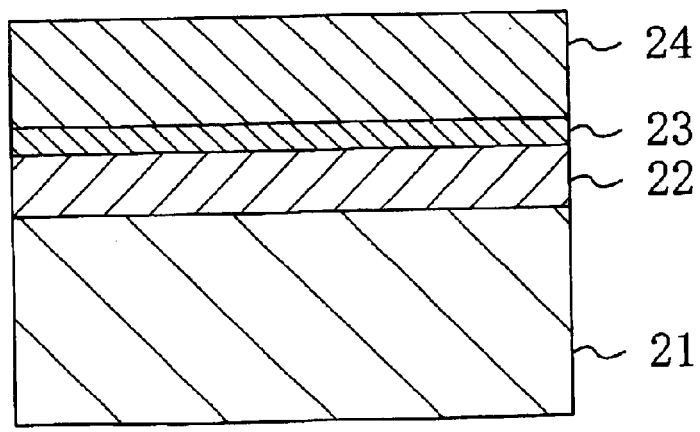
FIG. 4 is a cross-sectional view illustrating a group III-V compound semiconductor layered structure according to a second embodiment of the present invention.

FIG. 4 is a cross-sectional view illustrating a group III-V compound semiconductor layered structure according to the second embodiment. As illustrated in FIG. 4, an AlGaInP layer 22 made of $Ga_{0.5}In_{0.5}P$ having a thickness of about 30 nm, a buffer layer 23 made of GaAs having a thickness of about 1.6 nm, and an AlGaAs layer 24 made of $Al_{0.6}Ga_{0.4}As$ having a thickness of about 0.3 μm, are deposited on a substrate 21 made of GaAs.

Such a group III-V compound semiconductor layered structure can be formed by using an MOVPE method, for example, as in the first embodiment.

A feature of the second embodiment is that the AlGaAs layer 24 is formed on the AlGaInP layer 22 via the buffer layer 23 made of AlGaAs, and the Al content in the buffer layer 23 is smaller than that in the AlGaAs layer 24. Thus, instead of depositing the AlGaAs layer 24 made of $Al_{0.6}Ga_{0.4}As$ directly on the AlGaInP layer 22, the AlGaAs layer 24 is deposited on the buffer layer 23 made of GaAs whose Al content is smaller than that of the AlGaAs layer 24, thereby reducing the crystal defect density at the interface between the AlGaInP layer 22 and the buffer layer 23.

Furthermore, since the thickness of the buffer layer 23 is as small as about 1.6 nm, the buffer layer 23 does not substantially influence the properties of the group III-V compound semiconductor layered structure such as the optical and electrical characteristics thereof.

Thus, in the group III-V compound semiconductor layered structure of the second embodiment, the buffer layer 23 made of AlGaAs is interposed between the semiconductor layers, whereby it is possible to reduce the crystal defect density from that of a reference layered structure in which the AlGaAs layer 24 is deposited directly on the AlGaInP layer 22, while obtaining substantially the same properties as those of such a reference layered structure.

Herein, the AlGaAs compositions of the buffer layer 23 and the AlGaAs layer 24 are not limited to GaAs and $Al_{0.6}Ga_{0.4}As$, respectively, but may alternatively be any other suitable compositions as long as the Al content in the buffer layer 23 is smaller than that in the AlGaAs layer 24. Of course, the effect of reducing the crystal defect density is greater as the Al content in the buffer layer 23 is smaller.

Moreover, the AlGaInP composition of the AlGaInP layer 22 is not limited to $Ga_{0.5}In_{0.5}P$, but may alternatively be any other suitable composition defined as $Al_xGa_yIn_{1-x-y}P$ (where $0 \leq x \leq 1$, $0 \leq y \leq 1$, $0 \leq x+y \leq 1$).

Moreover, the thickness of the buffer layer 23 is preferably 0.5 nm or more and 5 nm or less. If it is less than 0.5 nm, the crystal defect density at the interface between the AlGaInP layer 22 and the buffer layer 23 reflects the Al content in the AlGaAs layer 24, and the effect of reducing the crystal defect density by the buffer layer 23 is insufficient. On the other hand, if it is greater than 5 nm, the buffer layer 23 will give a non-negligible influence on the physical properties of the group III-V compound semiconductor layered structure.

In the second embodiment, it is not necessary that the buffer layer 23 is in contact with the AlGaAs layer 24. For example, a semiconductor layer made of AlGaAs whose Al content is smaller than that of the buffer layer 23 may alternatively be inserted between the buffer layer 23 and the AlGaAs layer 24. Also in such a case, it is only required that the Al content in the buffer layer 23 is smaller than that in the AlGaAs layer 24.

Moreover, the layered structure including the AlGaInP layer 22, the buffer layer 23 and the AlGaAs layer 24 is not required to be formed on the substrate 21. For example, it may alternatively be formed on another semiconductor layer as a part of a layered structure in a semiconductor device such as a field effect transistor, a heterojunction bipolar transistor, a semiconductor laser device or a light emitting diode.

Moreover, in the AlGaInP layer 22, the In content is set to be 0.5 for the lattice match with the substrate 21 made of GaAs. However, for the purpose of realizing a lattice match with the substrate 21, the In content, 1−x−y, is not limited to 0.5, but may alternatively be any other suitable value as long as it satisfies $0.45 \leq 1-x-y \leq 0.55$. Moreover, if the lattice match with GaAs is not required, the In content, 1−x−y, is only required to satisfy $0 \leq 1-x-y \leq 1$.

As described above, according to the second embodiment, the AlGaAs layer 24 is formed on the AlGaInP layer 22 via the buffer layer 23 made of AlGaAs, and the Al content in the buffer layer 23 is smaller than that in the AlGaAs layer 24. In this way, it is possible to obtain a group III-V compound semiconductor layered structure in which the crystal defect density is reduced from that of a reference group III-V compound semiconductor layered structure in which the AlGaAs layer 24 is deposited directly on the AlGaInP layer 22, while obtaining substantially the same properties as those of such a reference group III-V compound semiconductor layered structure.

Third Embodiment

A semiconductor laser device according to the third embodiment will now be described with reference to the drawings.

Figure 5:
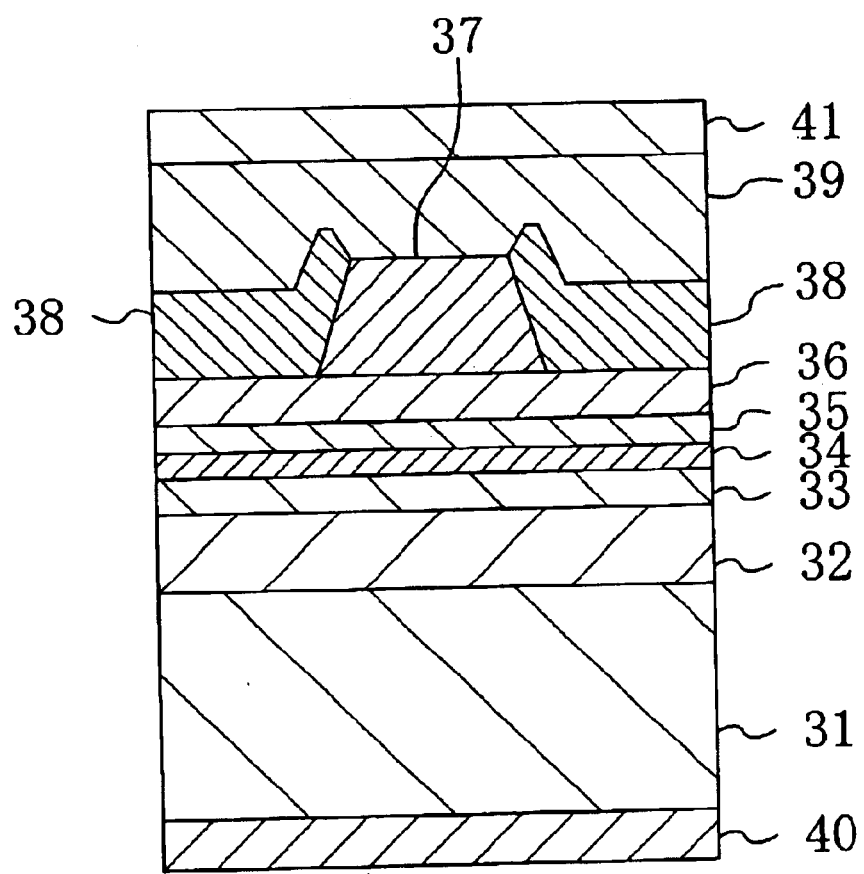
FIG. 5 is a cross-sectional view illustrating a semiconductor laser device according to a third embodiment of the present invention.

FIG. 5 is a cross-sectional view illustrating the semiconductor laser device according to the third embodiment of the present invention. As illustrated in FIG. 5, an n-type cladding layer, 32 made of n-type AlGaInP, an active layer 33 including a multiple quantum well and optical guiding layers interposing the multiple quantum well therebetween, a buffer layer 34 made of AlGaInP, a dopant diffusion preventing layer 35 made of AlGaAs, and a first p-type cladding layer 36 made of p-type AlGaInP, are deposited in this order on a substrate 31 made of n-type GaAs.

Note that in the active layer 33, the multiple quantum well has an alternating pattern of three well layers made of GaInP and two barrier layers made of AlGaInP, with two of the well layers being the outermost layers of the multiple quantum well, and an optical guiding layer made of AlGaInP is formed on the upper side and on the lower side of the multiple quantum well.

A second p-type cladding layer 37 made of p-type AlGaInP is formed in a stripe shape on the first p-type cladding layer 36. Moreover, a current blocking layer 38 made of n-type AlGaInP is formed on the upper surface of the first p-type cladding layer 36 beside the second p-type cladding layer 37 and on the side surface of the second p-type cladding layer 37. A contact layer 39 made of p-type GaAs is formed on the second p-type cladding layer 37 and the current blocking layer 38.

An n-side electrode 40 is formed under the substrate 31. The n-side electrode 40 is made of an alloy containing Au, Ge and Ni, for example, and is in ohmic contact with the substrate 31. Moreover, a p-side electrode 41 is formed on the contact layer 39. The p-side electrode 41 is made of an alloy containing Cr, Pt and Au, for example, and is in ohmic contact with the contact layer 39.

Herein, the structure is doped with Si as an n-type impurity and Zn as a p-type impurity. Moreover, the doping concentration is substantially equal to the carrier concentration at room temperature.

Table 1 below shows, as an example, the specific thickness, compound composition and doping concentration of each of the semiconductor layers.

TABLE 1

| Semiconductor layer | Thickness | Compound Composition | Doping concentration (cm$^{-3}$) | |
|---|---|---|---|---|
| Contact layer | 4.0 µm | GaAs | p-type | $2 \times 10^{18}$ |
| Second p-type cladding layer | 1.0 µm | Al$_{0.35}$Ga$_{0.15}$In$_{0.5}$P | p-type | $1 \times 10^{18}$ |
| Current blocking layer | 0.3 µm | Al$_{0.5}$In$_{0.5}$P | n-type | $1 \times 10^{18}$ |
| First p-type cladding layer | 0.2 µm | Al$_{0.35}$Ga$_{0.15}$In$_{0.5}$P | p-type | $1 \times 10^{18}$ |
| Dopant diffusion preventing layer | 25 nm | Al$_{0.8}$Ga$_{0.2}$As | — | — |
| Buffer layer | 1.1 nm | Al$_{0.5}$In$_{0.5}$P | — | — |
| Active layer Multiple quantum well | | | | |
| Well layers | 5 nm each | Ga$_{0.5}$In$_{0.5}$P | — | — |
| Barrier layers | 6 nm each | Al$_{0.25}$Ga$_{0.25}$In$_{0.5}$P | — | — |
| Optical guiding layers | 25 nm each | Al$_{0.25}$Ga$_{0.25}$In$_{0.5}$P | — | — |
| N-type cladding layer | 1.5 µm | Al$_{0.35}$Ga$_{0.15}$In$_{0.5}$P | n-type | $1 \times 10^{18}$ |
| N-type substrate | 100 µm | GaAs | n-type | $1 \times 10^{18}$ |

As shown in Table 1 above, the Ga content in the buffer layer 34 is smaller than that in the optical guiding layers. Thus, in the semiconductor laser device of the third embodiment, the layered structure including an optical guiding layer, the buffer layer 34 and the dopant diffusion preventing layer 35, which are deposited in this order, is similar to the group III-V compound semiconductor layered structure of the first embodiment.

In the third embodiment, the In content, 1−x−y, in each semiconductor layer made of Al$_x$Ga$_y$In$_{1-x-y}$P is set to be 0.5 for the lattice match with the substrate 31 made of GaAs. Note however that for the purpose of realizing a lattice match with the substrate 31 made of GaAs, the In content, 1−x−y, in each semiconductor layer made of Al$_x$Ga$_y$In$_{1-x-y}$P is not limited to 0.5, but may alternatively be any other suitable value as long as it satisfies $0.45 \leq 1-x-y \leq 0.55$.

In the semiconductor laser device of the third embodiment, the active layer 33 has a multiple quantum well structure with a band gap corresponding to a wavelength of 650 nm. Therefore, as the current passes through the gap in the current blocking layer 38 and reaches the active layer 33, laser light is emitted with an oscillation wavelength of 650 nm.

The dopant diffusion preventing layer 35 prevents Zn, which is a dopant of the first p-type cladding layer 36, from diffusing into the active layer 33 while manufacturing or operating the semiconductor laser device. In this way, it is possible to increase the doping concentration of the first p-type cladding layer 36 without influencing the active layer 33, whereby it is possible to reliably suppress the overflow of electrons from the active layer 33 into the first p-type cladding layer 36.

Furthermore, the buffer layer 34 is formed between the active layer 33 and the dopant diffusion preventing layer 35. Herein, an optical guiding layer that is the uppermost layer of the active layer 33 is made of Al$_{0.25}$Ga$_{0.25}$In$_{0.5}$P, and the buffer layer 34 is made of Al$_{0.5}$In$_{0.5}$P. Thus, the Ga content in the buffer layer 34 is smaller than that in the optical guiding layer, whereby the crystal defect density at the interface between the buffer layer 34 and the dopant diffusion preventing layer 35 can be reduced from that when the dopant diffusion preventing layer 35 is formed directly on the active layer 33. Specifically, the number of crystal defects per square centimeter at the interface between the buffer layer 34 and the dopant diffusion preventing layer 35 is on the order of 10.

Herein, the band gap of the buffer layer 34 is transparent to laser light having an oscillation wavelength of 650 nm, and the thickness thereof is as small as 1.1 nm, whereby the buffer layer 34 has substantially no influence on the optical characteristics (e.g., the divergence angle) or the electrical characteristics (e.g., the operating current value) of the semiconductor laser device.

Note that in the third embodiment, the compound composition of the buffer layer 34 is not limited to Al$_{0.5}$In$_{0.5}$P, but may alternatively be any other suitable composition as long as it is AlGaInP whose Ga content is smaller than that in the optical guiding layer that is the uppermost layer of the active layer 33. Moreover, it is not necessary that the buffer layer 34 is formed directly on the active layer 33. For example, the buffer layer 34 may be made of Al$_{0.45}$Ga$_{0.05}$In$_{0.5}$P, while a semiconductor layer made of Al$_{0.5}$In$_{0.5}$P, for example, may be inserted between the active layer 33 and the buffer layer 34, and it is still possible to obtain the effect of reducing the crystal defect density at the interface between the buffer layer 34 and the dopant diffusion preventing layer 35.

As described above, according to the third embodiment, the buffer layer 34 is formed between the optical guiding layer that is the uppermost layer of the active layer 33 and the dopant diffusion preventing layer 35, whereby it is possible to form the dopant diffusion preventing layer 35 with a reduced crystal defect density. Therefore, even if the doping concentration of the first p-type cladding layer 36 is increased, the impurity will not diffuse into the active layer 33. In this way, it is possible to reliably suppress the overflow of electrons from the active layer 33 into the first p-type cladding layer 36, whereby it is possible to realize, with a reduced defect density, a red semiconductor laser device having a desirable temperature characteristic.

Fourth Embodiment

A semiconductor laser device according to the fourth embodiment will now be described with reference to the drawings.

Figure 6:
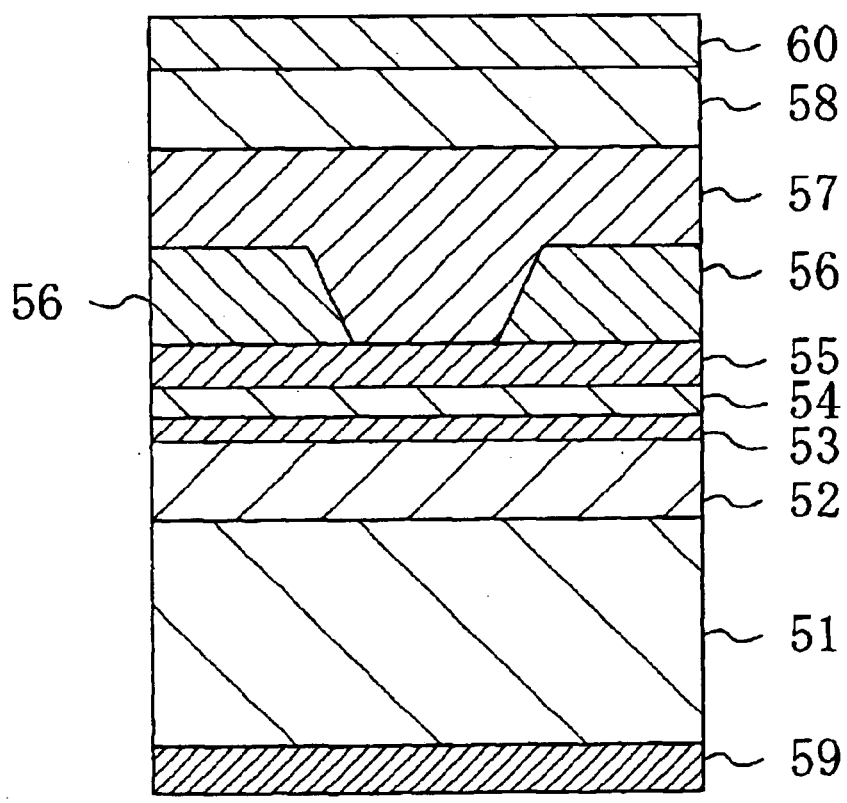
FIG. 6 is a cross-sectional view illustrating a semiconductor laser device according to a fourth embodiment of the present invention.

FIG. 6 is a cross-sectional view illustrating the semiconductor laser device according to the fourth embodiment of the present invention. As illustrated in FIG. 6, an n-type cladding layer 52 made of n-type AlGaInP, a buffer layer 53 made of GaAs, an active layer 54 including a multiple quantum well and optical guiding layers interposing the multiple quantum well therebetween, and a first p-type cladding layer 55 made of p-type AlGaInP, are deposited in this order on a substrate 51 made of n-type GaAs.

Note that in the active layer 54, the multiple quantum well has an alternating pattern of two well layers made of GaAs and one barrier layer made of AlGaAs, with the two well layers being the outermost layers of the multiple quantum well, and an optical guiding layer made of AlGaAs is formed on the upper side and on the lower side of the multiple quantum well.

A current blocking layer 56 made of n-type AlGaInP having a stripe-shaped opening is formed on the first p-type cladding layer 55, and a second p-type cladding layer 57 made of p-type AlGaInP is formed on the first p-type cladding layer 55 and the current blocking layer 56. A contact layer 58 made of p-type GaAs is formed on the second p-type cladding layer 57.

An n-side electrode 59 is formed under the substrate 51. The n-side electrode 59 is made of an alloy containing Au, Ge and Ni, for example, and is in ohmic contact with the substrate 51. Moreover, a p-side electrode 60 is formed on the contact layer 58. The p-side electrode 60 is made of an alloy containing Cr, Pt and Au, for example, and is in ohmic contact with the contact layer 58.

Herein, the structure is doped with Si as an n-type impurity and Zn as a p-type impurity. Moreover, the doping concentration is substantially equal to the carrier concentration at room temperature.

Table 2 below shows, as an example, the specific thickness, compound composition and doping concentration of each of the semiconductor layers.

TABLE 2

| Semiconductor layer | Thickness | Compound Composition | Doping | concentration (cm$^{-3}$) |
|---|---|---|---|---|
| Contact layer | 4.0 µm | GaAs | p-type | $2 \times 10^{18}$ |
| Second p-type cladding layer | 1.0 µm | $Al_{0.35}Ga_{0.15}In_{0.5}P$ | p-type | $1 \times 10^{18}$ |
| Current blocking layer | 0.3 µm | $Al_{0.5}In_{0.5}P$ | n-type | $1 \times 10^{18}$ |
| First p-type cladding layer | 0.2 µm | $Al_{0.35}Ga_{0.15}In_{0.5}P$ | p-type | $5 \times 10^{17}$ |
| Active layer Multiple quantum well | | | | |
| Well layers | 4 nm each | GaAs | — | — |
| Barrier layer | 8 nm | $Al_{0.3}Ga_{0.7}As$ | — | — |
| Optical guiding layers | 15 nm each | $Al_{0.5}Ga_{0.5}As$ | — | — |
| Buffer layer | 1.6 nm | GaAs | — | — |
| N-type cladding layer | 1.5 µm | $Al_{0.35}Ga_{0.15}In_{0.5}P$ | n-type | $1 \times 10^{18}$ |
| Substrate | 100 µm | GaAs | n-type | $1 \times 10^{18}$ |

As shown in Table 2 above, the Al content in the buffer layer 53 is smaller than that in the optical guiding layers. Thus, in the semiconductor laser device of the fourth embodiment, the layered structure including the n-type cladding layer 52, the buffer layer 53 and an optical guiding layer, which are deposited in this order, is similar to the group III-V compound semiconductor layered structure of the second embodiment.

In the fourth embodiment, the In content, 1−x−y, in each semiconductor layer made of $Al_xGa_yIn_{1-x-y}P$ is set to be 0.5 for the lattice match with the substrate 51 made of GaAs. Note however that for the purpose of realizing a lattice match with the substrate 51 made of GaAs, the In content, 1−x−y, in each semiconductor layer made of $Al_xGa_yIn_{1-x-y}P$ is not limited to 0.5, but may alternatively be any other suitable value as long as it satisfies $0.45 \leq 1-x-y \leq 0.55$.

In the semiconductor laser device of the fourth embodiment, the active layer 54 has a multiple quantum well structure with a band gap corresponding to a wavelength of 780 nm. Therefore, as the current passes through the gap in the current blocking layer 56 and reaches the active layer 54, laser light is emitted with an oscillation wavelength of 780 nm.

A feature of the fourth embodiment is that the buffer layer 53 is provided between the active layer 54 and the n-type cladding layer 52, the active layer 54 is made of an AlGaAs-based compound semiconductor, and each of the n-type cladding layer 52, the first p-type cladding layer 55 and the second p-type cladding layer 57 is made of an AlGaInP-based compound semiconductor.

While an AlGaAs-based material is used for the active layer 54, an AlGaInP-based material having a larger band gap is used for the n-type cladding layer 52, the first p-type cladding layer 55 and the second p-type cladding layer 57, whereby it is possible to provide a larger band gap difference (band offset) between the active layer and the cladding layers, as compared to a conventional semiconductor laser device in which an AlGaAs-based material is used for cladding layers. In this way, it is possible to reliably suppress the overflow of electrons from the active layer 54 into a cladding layer, whereby it is possible to reduce the threshold current value and improve the temperature characteristic.

Furthermore, the buffer layer 53 is formed between the n-type cladding layer 52 and the active layer 54. Herein, the buffer layer 53 is made of GaAs, and the optical guiding layer is made of $Al_{0.5}Ga_{0.5}As$. Thus, the Al content in the buffer layer 53 is smaller than that in the optical guiding layer, whereby the crystal defect density at the interface between the n-type cladding layer 52 and the buffer layer 53 can be reduced from that when the active layer 54 is formed directly on the n-type cladding layer 52. Specifically, the number of crystal defects per square centimeter at the interface between the n-type cladding layer 52 and the buffer layer 53 is on the order of 10.

Herein, since the buffer layer 53 has a sufficiently small thickness of 1.6 nm, the buffer layer 53 is transparent to light emitted from the active layer 54 due to the quantum effect, and has substantially no influence on the optical characteristics (e.g., the divergence angle) or the electrical characteristics (e.g., the operating current value) of the semiconductor laser device.

Note that in the fourth embodiment, the compound composition of the buffer layer 53 is not limited to GaAs, but may alternatively be any other suitable composition as long as it is AlGaAs whose Al content is smaller than that in the optical guiding layer that is the outermost layer of the active layer 54. Moreover, it is not necessary that the buffer layer 53 is formed directly on the active layer 54. For example, the buffer layer 53 may be made of $Al_{0.1}Ga_{0.9}As$, while a semiconductor layer made of GaAs, for example, may be inserted between the buffer layer 53 and the active layer 54, and it is still possible to obtain the effect of reducing the crystal defect density at the interface between the n-type cladding layer 52 and the buffer layer 53.

As described above, according to the fourth embodiment, the buffer layer 53 is formed between the optical guiding layer that is the outermost layer of the active layer 54 and the n-type cladding layer 52, whereby it is possible to form an optical guiding layer with a reduced crystal defect density. It is possible to use a cladding layer made of an AlGaInP-based semiconductor layer for an active layer made of an AlGaAs-based semiconductor layer, and to realize, with a reduced defect density, an infrared semiconductor laser device having a reduced threshold current and a desirable temperature characteristic.

Fifth Embodiment

A semiconductor laser device according to the fifth embodiment will now be described with reference to the drawings.

Figure 7:
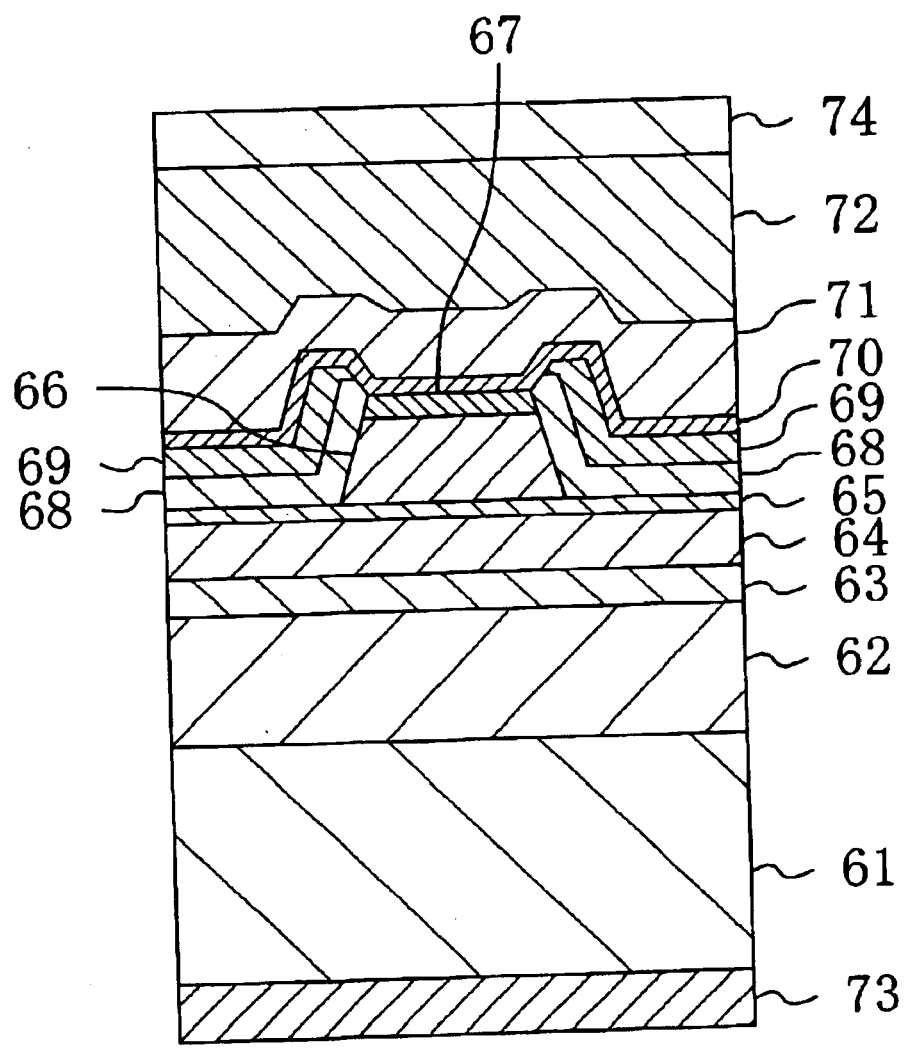
FIG. 7 is a cross-sectional view illustrating a semiconductor laser device according to a fifth embodiment of the present invention.

FIG. 7 is a cross-sectional view illustrating the semiconductor laser device according to the fifth embodiment of the present invention. As illustrated in FIG. 7, an n-type cladding layer 62 made of n-type AlGaInP, an active layer 63 including a multiple quantum well and optical guiding layers interposing the multiple quantum well therebetween, a first p-type cladding layer 64 made of p-type AlGaInP, and an etching stop layer 65 made of p-type GaInP, are deposited in this order on a substrate 61 made of n-type GaAs.

Note that in the active layer 63, the multiple quantum well has an alternating pattern of three well layers made of GaInP and two barrier layers made of AlGaInP, with two of the well layers being the outermost layers of the multiple quantum well, and an optical guiding layer made of AlGaInP is formed on the upper side and on the lower side of the multiple quantum well.

A second p-type cladding layer 66 made of p-type AlGaInP is formed in a stripe shape on the etching stop layer 65, and a first contact layer 67 made of p-type GaInP is formed on the second p-type cladding layer 66. Moreover, a first current blocking layer 68 made of n-type AlInP is formed on the upper surface of the etching stop layer 65 beside the second p-type cladding layer 66 and on the side surface of the second p-type cladding layer 66. A second current blocking layer 69 made of n-type GaAs is formed on the first current blocking layer 68.

A buffer layer 70 made of p-type AlInP, a second contact layer 71 made of p-type AlGaAs and a third contact layer 72 made of p-type GaAs are deposited in this order on the first contact layer 67 and the second current blocking layer 69.

An n-side electrode 73 is formed under the substrate 61. The n-side electrode 73 is made of an alloy containing Au, Ge and Ni, for example, and is in ohmic contact with the substrate 61. Moreover, a p-side electrode 74 is formed on the third contact layer 72. The p-side electrode 74 is made of an alloy containing Cr, Pt and Au, for example, and is in ohmic contact with the third contact layer 72.

Herein, the structure is doped with Si as an n-type impurity and Zn as a p-type impurity. Moreover, the doping concentration is substantially equal to the carrier concentration at room temperature.

Table 3 below shows, as an example, the specific thickness, compound composition and doping concentration of each of the semiconductor layers.

TABLE 3

| Semiconductor layer | Thickness | Compound Composition | Doping | concentration (cm$^{-3}$) |
|---|---|---|---|---|
| Third contact layer | 3.5 μm | GaAs | p-type | $2 \times 10^{18}$ |
| Second contact layer | 0.5 μm | $Al_{0.8}Ga_{0.2}As$ | p-type | $2 \times 10^{18}$ |
| Buffer layer | 0.6 nm | $Al_{0.5}In_{0.5}P$ | p-type | $1 \times 10^{18}$ |
| Second current blocking layer | 0.2 μm | GaAs | n-type | $1 \times 10^{18}$ |
| First current blocking layer | 0.3 μm | $Al_{0.5}In_{0.5}P$ | n-type | $1 \times 10^{18}$ |
| First contact layer | 50 nm | $Ga_{0.5}In_{0.5}P$ | p-type | $1 \times 10^{18}$ |
| Second p-type cladding layer | 1.0 μm | $Al_{0.35}Ga_{0.15}In_{0.5}P$ | p-type | $1 \times 10^{18}$ |
| Etching stop layer | 10 nm | $Ga_{0.5}In_{0.5}P$ | p-type | $1 \times 10^{18}$ |
| First p-type cladding layer | 0.2 μm | $Al_{0.35}Ga_{0.15}In_{0.5}P$ | p-type | $5 \times 10^{17}$ |
| Active layer Multiple quantum well | | | | |
| Well layers | 5 nm each | $Ga_{0.5}In_{0.5}P$ | — | — |
| Barrier layers | 6 nm each | $Al_{0.25}Ga_{0.25}In_{0.5}P$ | — | — |
| Optical guiding layers | 20 nm each | $Al_{0.25}Ga_{0.25}In_{0.5}P$ | — | — |
| N-type cladding layer | 1.5 μm | $Al_{0.35}Ga_{0.15}In_{0.5}P$ | n-type | $1 \times 10^{18}$ |
| Substrate | 100 μm | GaAs | n-type | $1 \times 10^{18}$ |

As shown in Table 3 above, the Ga content in the buffer layer 70 is smaller than that in the first contact layer 67. Thus, in the semiconductor laser device of the fifth embodiment, the layered structure including the first contact layer 67, the buffer layer 70 and the second contact layer 71, which are deposited in this order, is similar to the group III-V compound semiconductor layered structure of the first embodiment.

In the fifth embodiment, the In content, $1-x-y$, in each semiconductor layer made of $Al_xGa_yIn_{1-x-y}P$ is set to be 0.5 for the lattice match with the substrate 61 made of GaAs. Note however that for the purpose of realizing a lattice match with the substrate 61 made of GaAs, the In content, $1-x-y$, in each semiconductor layer made of $Al_xGa_yIn_{1-x-y}P$ is not limited to 0.5, but may alternatively be any other suitable value as long as it satisfies $0.45 \leq 1-x-y \leq 0.55$.

In the semiconductor laser device of the fifth embodiment, the active layer 63 has a multiple quantum well structure with a band gap corresponding to a wavelength of 650 nm. Therefore, as the current passes through the gap in the first current blocking layer 68 and the second current blocking layer 69 and reaches the active layer 63, laser light is emitted with an oscillation wavelength of 650 nm.

A feature of the fifth embodiment is the provision of the second contact layer 71 made of AlGaAs having a large Al content. When the semiconductor laser device is designed so that laser light is distributed also above the second p-type cladding layer 66 and the first contact layer 67, the second contact layer 71 is transparent to laser light having an oscillation wavelength of 650 nm, thereby reducing the absorption of light above the second p-type cladding layer 66. In this way, it is possible to realize a semiconductor laser device having a small threshold current and a small operating current.

Furthermore, the buffer layer 70 is formed between the first contact layer 67 and the second contact layer 71. Herein, the first contact layer 67 is made of $Ga_{0.5}In_{0.5}P$, and the buffer layer 70 is made of $Al_{0.5}In_{0.5}P$. Thus, the Ga content in the buffer layer 70 is smaller than that in the first contact layer 67, whereby the crystal defect density at the interface between the buffer layer 70 and the second contact layer 71 can be reduced from that when the second contact layer 71 is formed directly on the first contact layer 67. Specifically, the number of crystal defects per square centimeter at the interface between the buffer layer 70 and the second contact layer 71 is on the order of 10.

The first contact layer 67 is made of GaInP and has a function of reducing the potential barrier between the second p-type cladding layer 66 and the second contact layer 71. In this way, it is possible to reduce the operating voltage of the semiconductor laser device.

Moreover, the etching stop layer 65 is used to form the second p-type cladding layer 66 in a stripe shape. Specifically, after the first p-type cladding layer 64, the etching stop layer 65 and a second p-type cladding layer formation film are formed in this order on the active layer 63, a resist mask is formed on the second p-type cladding layer formation film by using a photolithography method, and the second p-type cladding layer formation film is etched with a mixed solution of sulfuric acid or tartaric acid and hydrochloric acid. In this process, the second p-type cladding layer formation film made of AlGaInP is etched, whereas the etching stop layer 65 made of GaInP is not substantially etched, thereby forming the stripe-shaped second p-type cladding layer 66 from the second p-type cladding layer formation film.

Note that in the fifth embodiment, the compound composition of the buffer layer 70 is not limited to $Al_{0.5}In_{0.5}P$, but may alternatively be any other suitable composition as long as it is AlGaInP whose Ga content is smaller than that in the first contact layer 67. Moreover, it is not necessary that the buffer layer 70 is formed directly on the first contact layer 67. For example, the buffer layer 70 may be made of $Al_{0.45}Ga_{0.05}In_{0.5}P$, while a semiconductor layer made of $Al_{0.5}In_{0.5}P$, for example, may be inserted between the first contact layer 67 and the buffer layer 70, and it is still possible to obtain the effect of reducing the crystal defect density at the interface between the second contact layer 71 and the buffer layer 70.

Moreover, the buffer layer 70 is not required to be formed on the first contact layer 67 and the second current blocking layer 69, but may alternatively be formed only on the first contact layer 67.

As described above, according to the fifth embodiment, the buffer layer 70 is formed between the first contact layer 67 and the second contact layer 71, whereby it is possible to form, with a reduced defect density, the second contact layer 71 made of AlGaAs having a band gap that is transparent to light emitted from the active layer 63. Thus, in a case where the semiconductor laser device is designed so that laser light is distributed also above the second p-type cladding layer 66, the loss of light in the second contact layer 71 is reduced, whereby it is possible to reduce the threshold current and the operating current of the semiconductor laser device.

First Variation of Fifth Embodiment

A semiconductor laser device according to the first variation of the fifth embodiment will now be described with reference to the drawings.

Figure 8:
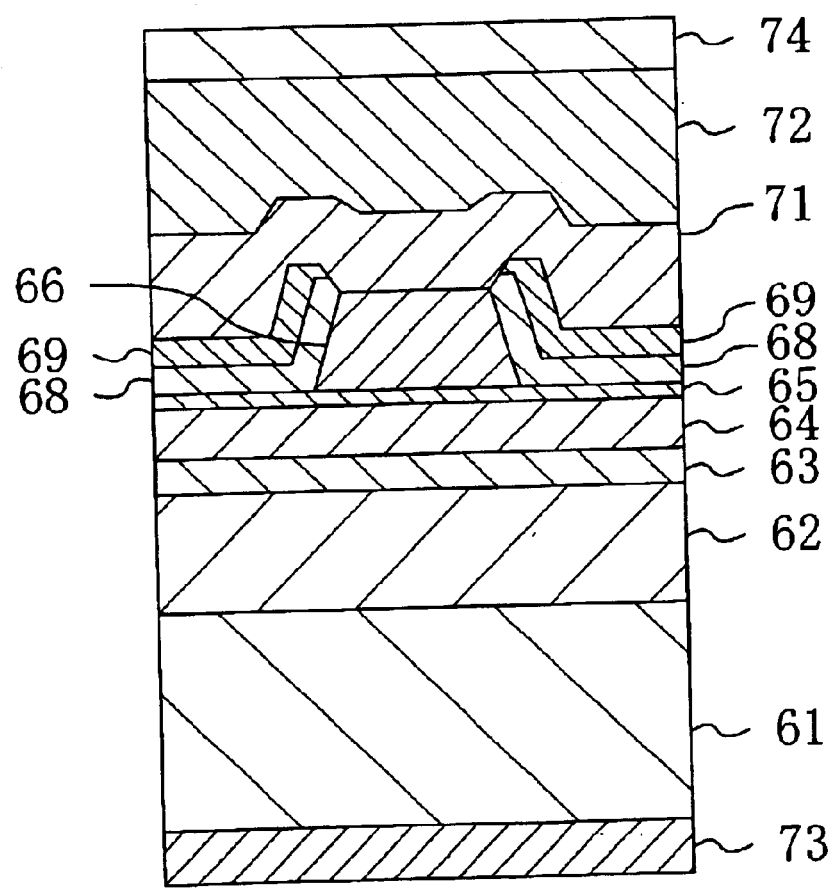
FIG. 8 is a cross-sectional view illustrating a semiconductor laser device according to a first variation of the fifth embodiment of the present invention.

FIG. 8 is a cross-sectional view illustrating the semiconductor laser device according to the first variation of the fifth embodiment. In FIG. 8, like components to those of the semiconductor laser device of the fifth embodiment illustrated in FIG. 7 are denoted by like reference numerals and will not be further described below.

As illustrated in FIG. 8, the n-type cladding layer 62, the active layer 63, the first p-type cladding layer 64, the etching stop layer 65 and the second p-type cladding layer 66 are deposited in this order on the substrate 61. The first current blocking layer 68 and the second current blocking layer 69 are deposited in this order on the upper surface of the etching stop layer 65 beside the second p-type cladding layer 66 and on the side surface of the second p-type cladding layer 66.

Moreover, the second contact layer 71 and the third contact layer 72 are deposited in this order on the second p-type cladding layer 66 and the second current blocking layer 69. The n-side electrode 73 is formed under the substrate 61, and the p-type electrode 74 is formed on the third contact layer 72.

The semiconductor laser device of the first variation differs from the semiconductor laser device of the fifth embodiment in that the first contact layer 67 made of GaInP and the buffer layer 70 are not provided on the second p-type cladding layer 66.

A feature of the semiconductor laser device of the first variation is that it is a layered structure in which the second contact layer 71 made of AlGaAs is deposited on the second p-type cladding layer 66 made of AlGaInP in which the Ga content of the second p-type cladding layer 66 is relatively small.

Herein, in a layered structure in which a semiconductor layer made of AlGaAs is deposited on a semiconductor layer made of AlGaInP, the crystal defect density is smaller as the Ga content of the AlGaInP layer is smaller, as illustrated in FIG. 1. In the first variation, the Ga content of the second p-type cladding layer 66 is 0.15, and the crystal defect density at the interface between the second p-type cladding layer 66 and the second contact layer 71 is about $1 \times 10^6/cm^2$. Of course, the crystal defect density can be further reduced by further reducing the Ga content of the second p-type cladding layer 66.

Second Variation of Fifth Embodiment

A semiconductor laser device according to the second variation of the fifth embodiment will now be described with reference to the drawings.

Figure 9:
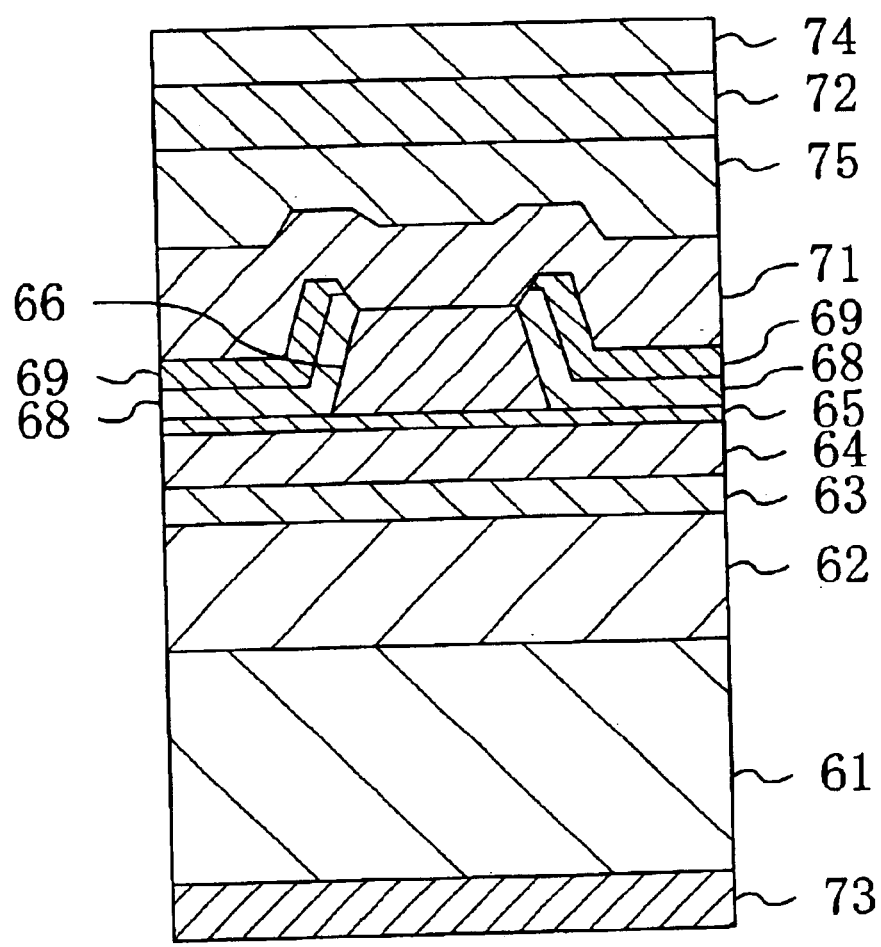
FIG. 9 is a cross-sectional view illustrating a semiconductor laser device according to a second variation of the fifth embodiment of the present invention.

FIG. 9 is a cross-sectional view illustrating the semiconductor laser device according to the second variation of the fifth embodiment. In FIG. 9, like components to those of the semiconductor laser device of the first variation illustrated in FIG. 8 are denoted by like reference numerals and will not be further described below.

As illustrated in FIG. 9, the semiconductor laser device of the second variation differs from the semiconductor laser device of the first variation in that a fourth contact layer 75 made of p-type $Al_{0.4}Ga_{0.6}As$ is formed between the second contact layer 71 and the third contact layer 72.

Herein, the band offset value of the valence band between the second contact layer 71 and the fourth contact layer 75 and that between the fourth contact layer 75 and the third contact layer 72 are 200 meV and 230 meV, respectively. On the other hand, when the fourth contact layer 75 is not provided, the band offset value of the valence band between the second contact layer 71 and the fourth contact layer is 430 meV. Therefore, in the semiconductor laser device of the second variation, the band offset is reduced by the provision of the fourth contact layer 75 as compared to the semiconductor laser device of the first variation.

Note that the AlGaAs composition of the fourth contact layer 75 is not limited to $Al_{0.4}Ga_{0.6}As$, but may alternatively be any other suitable composition as long as it is AlGaAs whose band gap is between those of the second contact layer 71 and the third contact layer 72. Moreover, the band offset value can be further reduced by providing a plurality of AlGaAs layers having gradually varied Al contents between the second contact layer 71 and the third contact layer 72.

Thus, with the semiconductor laser device of the second variation, even if the Al content of the second contact layer 71 is set to be high so that the second contact layer 71 is transparent to the wavelength of light emitted from the active layer 63, it is possible to reduce the band offset of the valence band and thus to reduce the operating voltage by providing an AlGaAs layer whose band gap is between those of the second contact layer 71 and the third contact layer 72.

Third Variation of Fifth Embodiment

A semiconductor laser device according to the third variation of the fifth embodiment will now be described with reference to the drawings.

Figure 10:
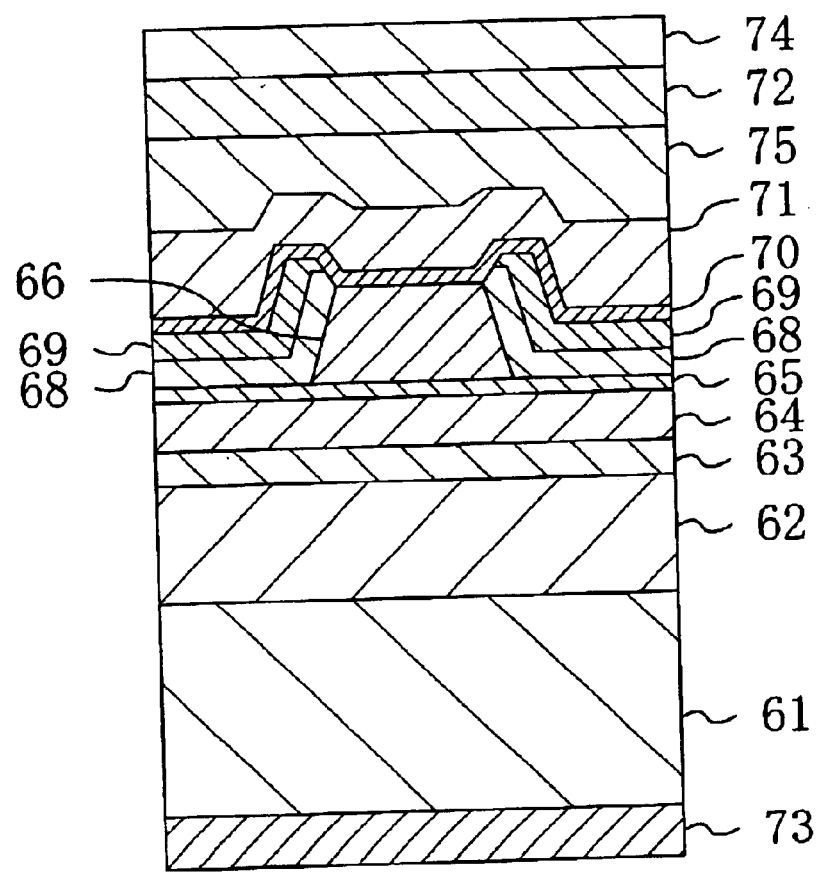
FIG. 10 is a cross-sectional view illustrating a semiconductor laser device according to a third variation of the fifth embodiment of the present invention.

FIG. 10 is a cross-sectional view illustrating the semiconductor laser device according to the third variation of the fifth embodiment. In FIG. 10, like components to those of the semiconductor laser device of the second variation illustrated in FIG. 9 are denoted by like reference numerals and will not be further described below.

As illustrated in FIG. 10, the semiconductor laser device of the third variation differs from the semiconductor laser device of the second variation in that the buffer layer 70 is provided between the second p-type cladding layer 66 and the second contact layer 71 and between the second current blocking layer 69 and the second contact layer 71.

Herein, the composition and the thickness of the buffer layer 70 are the same as those in the fifth embodiment, and the Ga content therein is smaller than that in the second p-type cladding layer 66. Thus, in the semiconductor laser device of the third variation, the layered structure including the second p-type cladding layer 66, the buffer layer 70 and the second contact layer 71, which are deposited in this order, is similar to the group III-V compound semiconductor layered structure of the first embodiment.

Therefore, it is possible to reduce the crystal defect density at the interface between the buffer layer 70 and the second contact layer 71 as compared to the semiconductor laser devices of the first variation and the second variation in which the second contact layer 71 is deposited directly on the second p-type cladding layer 66.

Moreover, the thickness of the buffer layer 70 is as small as 1.1 nm, whereby the buffer layer 70 has substantially no influence on the characteristics of the semiconductor laser device such as the operating current value, the divergence angle and the operating voltage thereof.

With the semiconductor laser device of the third variation, the crystal defect density at the interface between the buffer layer 70 and the second contact layer 71 is not dependent on the composition of the second p-type cladding layer 66. Therefore, it is possible to reduce the crystal defect density while suitably adjusting the composition of the second p-type cladding layer 66, which is a parameter that has a significant influence on the characteristics of a semiconductor laser device such as the vertical divergence angle and the operating current thereof.

Note that the buffer layer 70 is not required to be formed on the second current blocking layer 69 as long as it is formed on the second p-type cladding layer 66.

Moreover, the composition of the buffer layer 70 is not limited to $Al_{0.5}In_{0.5}P$, but may alternatively be any other suitable composition as long as it is AlGaInP whose Al content is larger than that of the second p-type cladding layer 66.

Fourth Variation of Fifth Embodiment

A semiconductor laser device according to the fourth variation of the fifth embodiment will now be described with reference to the drawings.

Figure 11:
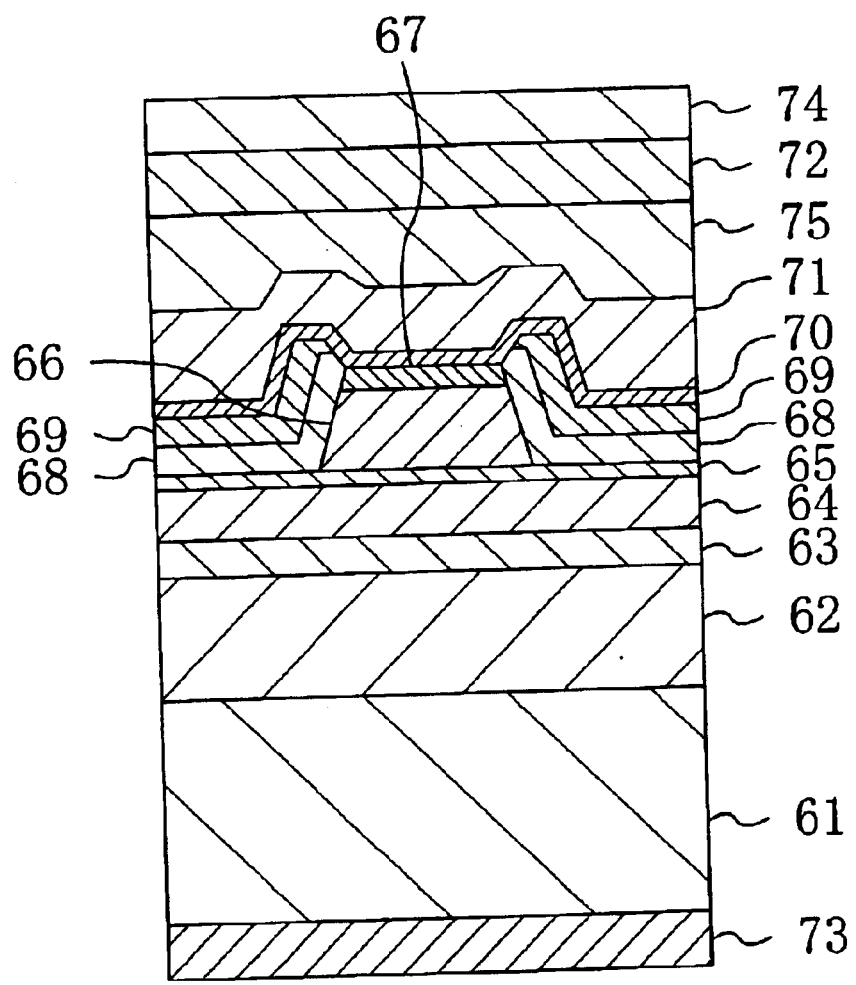
FIG. 11 is a cross-sectional view illustrating a semiconductor laser device according to a fourth variation of the fifth embodiment of the present invention.

FIG. 11 is a cross-sectional view illustrating the semiconductor laser device according to the fourth variation of the fifth embodiment. In FIG. 11, like components to those of the semiconductor laser device of the third variation illustrated in FIG. 10 are denoted by like reference numerals and will not be further described below.

As illustrated in FIG. 11, the semiconductor laser device of the fourth variation differs from the semiconductor laser device of the third variation in that the first contact layer 67 is provided between the second p-type cladding layer 66 and the buffer layer 70.

Herein, the composition and the thickness of the first contact layer 67 are the same as those in the fifth embodiment, and the Ga content in the buffer layer 70 is smaller than that in the first contact layer 67. Thus, in the semiconductor laser device of the fourth variation, the layered structure including the first contact layer 67, the buffer layer 70 and the second contact layer 71, which are deposited in this order, is similar to the group III-V compound semiconductor layered structure of the first embodiment, and the crystal defect density at the interface between the first contact layer 67 and the second contact layer 71 is reduced.

Moreover, the semiconductor laser device of the fourth variation has a function of reducing the potential barrier between the second p-type cladding layer 66 and the second contact layer 71. In this way, it is possible to reduce the operating voltage of the semiconductor laser device.

When the second contact layer 71 is formed directly on the first contact layer 67, the crystal defect density at the interface between the first contact layer 67 and the second contact layer 71 is about $3 \times 10^7/cm^2$, and the device deteriorates during its operation, whereby it is not possible to ensure sufficient reliability of the semiconductor laser device. In contrast, in the third variation, the buffer layer 70 is provided between the first contact layer 67 and the second contact layer 71, whereby the number of crystal defects per square centimeter is reduced to be on the order of 10.

As described above, with the semiconductor laser devices of the fifth embodiment and the variations thereof, the second contact layer 71 can be formed with a reduced crystal defect density by using AlGaAs having a band gap that is transparent to the wavelength of light emitted from the active layer. Therefore, it is possible to realize a very reliable semiconductor laser device with a high output power and a high luminance that does not deteriorate under severe operating environments such as during a high output power operation at a high temperature. Specifically, these semiconductor laser devices are capable of operating at an output power as high as 120 mW without saturating its output power even at an environmental temperature of about 70° C.

Note that in the fifth embodiment and the variations thereof, the material of the substrate 61 is not limited to n-type GaAs, but the substrate 61 may alternatively be a p-type substrate made of p-type GaAs, for example.

Moreover, in the semiconductor laser devices of the fifth embodiment and the variations thereof, a real refractive index waveguide is formed by using AlInP for the first current blocking layer 68. Alternatively, a complex refractive index waveguide may be formed by using GaAs for the first current blocking layer 68.

Moreover, in the semiconductor laser devices of the fifth embodiment and the variations thereof, the active layer 63 is not limited to those of a multiple quantum well structure, but may alternatively be an active layer of a single quantum well structure or a single bulk active layer, for example.

Moreover, in the semiconductor laser devices of the fifth embodiment and the variations thereof, the waveguide structure is not limited to a ridge-shaped waveguide structure, but may alternatively be any other suitable structure such as an internal stripe-shaped waveguide structure, and it is still possible to obtain similar effects.

Sixth Embodiment

A semiconductor laser device according to the sixth embodiment will now be described with reference to the drawings.

Figure 12:
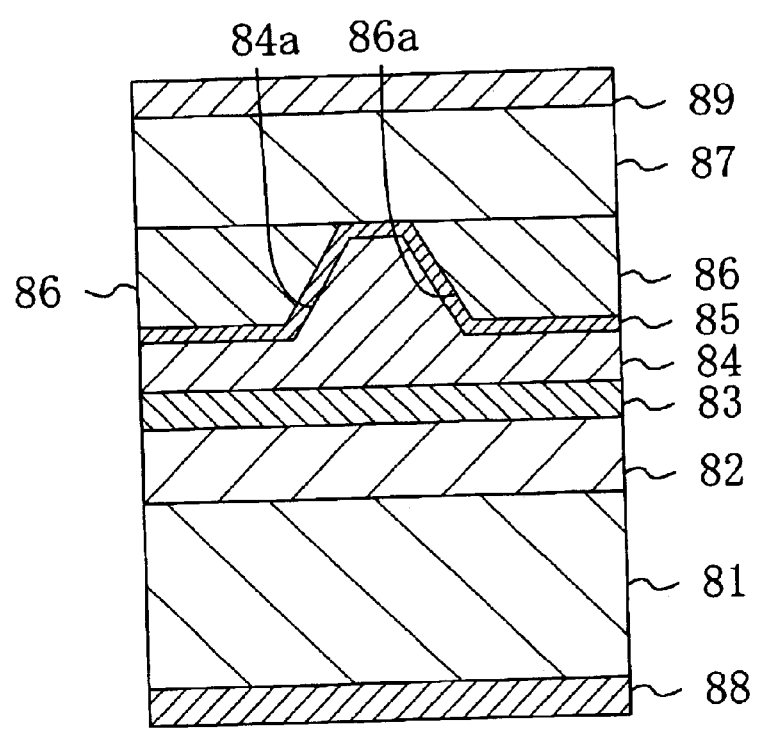
FIG. 12 is a cross-sectional view illustrating a semiconductor laser device according to a sixth embodiment of the present invention.

FIG. 12 is a cross-sectional view illustrating the semiconductor laser device according to the sixth embodiment of the present invention. As illustrated in FIG. 12, an n-type cladding layer 82 made of n-type AlGaInP, an active layer 83 including a multiple quantum well and optical guiding layers interposing the multiple quantum well therebetween, and a p-type cladding layer 84 made of p-type AlGaInP and including a stripe-shaped protrusion 84a, are deposited in this order on a substrate 81 made of n-type GaAs.

Note that in the active layer 83, the multiple quantum well has an alternating pattern of three well layers made of GaInP and two barrier layers made of AlGaInP, with two of the well layers being the outermost layers of the multiple quantum well, and an optical guiding layer made of AlGaInP is formed on the upper side and on the lower side of the multiple quantum well.

A buffer layer 85 made of p-type AlGaInP is formed on the p-type cladding layer 84 including the stripe-shaped protrusion 84a, and a current blocking layer 86 made of n-type AlGaAs and including an opening 86a opposing the wall surface of the protrusion 84a is formed on the buffer layer 85. A contact layer 87 made of p-type GaAs is formed on the current blocking layer 86 and on a portion of the buffer layer 85 over the top surface of the protrusion 84a.

An n-side electrode 88 is formed under the substrate 81. The n-side electrode 88 is made of an alloy containing Au, Ge and Ni, for example, and is in ohmic contact with the substrate 81. Moreover, a p-side electrode 89 is formed on the contact layer 87. The p-side electrode 89 is made of an alloy containing Cr, Pt and Au, for example, and is in ohmic contact with the contact layer 87.

Herein, the structure is doped with Si as an n-type impurity and Zn as a p-type impurity. Moreover, the doping concentration is substantially equal to the carrier concentration at room temperature.

Among the semiconductor layers described above, the p-type cladding layer 84 is made of $Al_{0.35}Ga_{0.15}In_{0.5}P$, the buffer layer 85 is made of $Al_{0.5}In_{0.5}P$, and the current blocking layer 86 is made of $Al_{0.9}Ga_{0.1}As$. The compositions of the other semiconductor layers may be the same as those of the third embodiment (Table 1 above).

In the semiconductor laser device of the sixth embodiment, the buffer layer 85 made of AlGaInP is formed between the p-type cladding layer 84 made of AlGaInP and the current blocking layer 86 made of AlGaAs, and the Ga content in the buffer layer 85 is smaller than that in the p-type cladding layer 84. Thus, in the semiconductor laser device of the sixth embodiment, the layered structure including the p-type cladding layer 84, the buffer layer 85 and the current blocking layer 86, which are deposited in this order, is similar to the group III-V compound semiconductor layered structure of the first embodiment.

In the sixth embodiment, the In content, 1−x−y, in each semiconductor layer made of $Al_xGa_yIn_{1-x-y}P$ is set to be 0.5 for the lattice match with the substrate 81 made of GaAs. Note however that for the purpose of realizing a lattice match with the substrate 81 made of GaAs, the In content, 1−x−y, in each semiconductor layer made of $Al_xGa_yIn_{1-x-y}P$ is not limited to 0.5, but may alternatively be any other suitable value as long as it satisfies $0.45 \leq 1-x-y \leq 0.55$.

In the semiconductor laser device of the sixth embodiment, the active layer 83 has a multiple quantum well structure with a band gap corresponding to a wavelength of 650 nm. Therefore, as the current passes through the gap in the current blocking layer 86 and reaches the active layer 83, laser light is emitted with an oscillation wavelength of 650 nm.

The current blocking layer 86 is made of AlGaAs whose band gap is larger than that of the p-type cladding layer 84, and can be made transparent to light emitted from the active layer 83. Therefore, in a case where the semiconductor laser device is designed so that laser light is distributed also above the p-type cladding layer 84, the loss of laser light in the current blocking layer 86 is reduced, whereby it is possible to reduce the threshold current and the operating current of the semiconductor laser device.

Furthermore, the buffer layer 85 is formed between the p-type cladding layer 84 and the current blocking layer 86. Herein, the p-type cladding layer 84 is made of $Al_{0.35}Ga_{0.15}In_{0.5}P$, and the buffer layer 85 is made of $Al_{0.5}In_{0.5}P$. Thus, the Ga content in the buffer layer 85 is smaller than that in the p-type cladding layer 84, whereby the crystal defect density at the interface between the buffer layer 85 and the current blocking layer 86 can be reduced from that when the current blocking layer 86 is formed directly on the p-type cladding layer 84.

Moreover, in the sixth embodiment, the buffer layer 85 is doped with a p-type impurity, and it thus functions as a part of the p-type cladding layer.

Note that in the sixth embodiment, the compound composition of the buffer layer 85 is not limited to $Al_{0.5}In_{0.5}P$, but may alternatively be any other suitable composition as long as it is AlGaInP whose Ga content is smaller than that in the p-type cladding layer 84. Moreover, it is not necessary that the buffer layer 85 is formed directly on the p-type cladding layer 84. For example, the buffer layer 85 may be made of $Al_{0.45}Ga_{0.05}In_{0.5}P$, while a semiconductor layer made of $Al_{0.5}In_{0.5}P$, for example, may be inserted between the p-type cladding layer 84 and the buffer layer 85, and it is still possible to obtain the effect of reducing the crystal defect density at the interface between the buffer layer 85 and the current blocking layer 86.

Next, a method for manufacturing the semiconductor laser device of the sixth embodiment having such a structure will now be described with reference to the drawings.

Figure 13A:
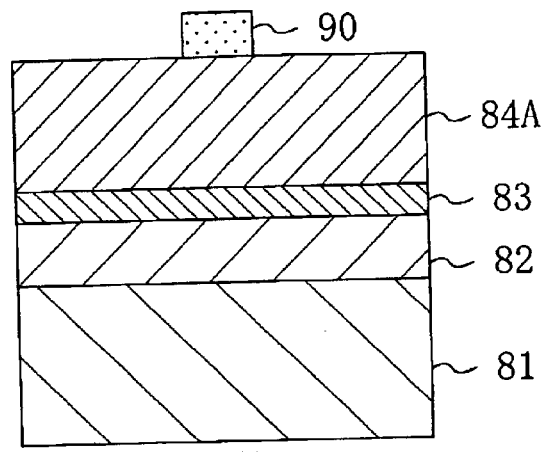
FIG. 13A to FIG. 13C are cross-sectional views sequentially illustrating steps in a method for manufacturing a semiconductor laser device according to the sixth embodiment of the present invention.
Figure 13B:
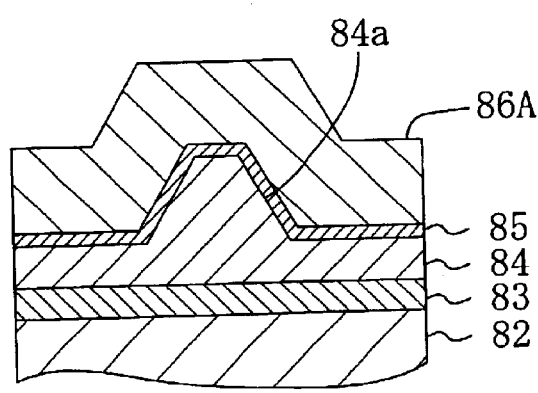
Figure 13C:
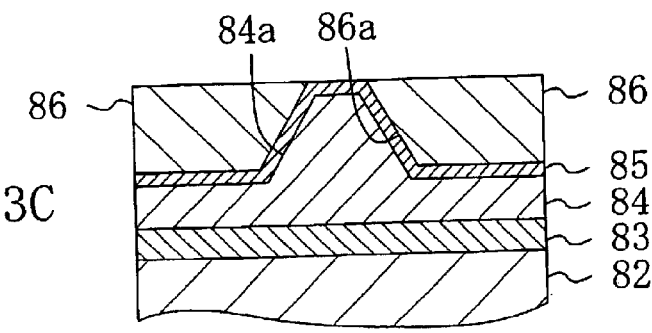

FIG. 13A to FIG. 13C are cross-sectional views sequentially illustrating steps in a method for manufacturing a semiconductor laser device according to the sixth embodiment. Note that a portion of the structure below the active layer 83 is omitted in FIG. 13B and FIG. 13C, because it is as illustrated in FIG. 13A.

First, as illustrated in FIG. 13A, the n-type cladding layer 82 made of n-type AlGaInP, the active layer 83, and a p-type cladding layer formation, layer 84A made of p-type AlGaInP, are grown in this order on the substrate 81 made of n-type GaAs by using an MOVPE method. Then, a stripe-shaped silicon oxide film 90 is formed on the p-type cladding layer formation layer 84A.

Herein, the active layer 83 is obtained by successively growing the component layers thereof so that a plurality of well layers made of GaInP and a plurality of barrier layers made of AlGaInP are deposited in an alternating pattern between two optical guiding layers made of AlGaInP.

Then, as illustrated in FIG. 13B, the p-type cladding layer formation layer 84A is etched while using the silicon oxide film 90 as a mask to form the p-type cladding layer 84 including the stripe-shaped protrusion 84a, and the silicon oxide film 90 is removed by using hydrogen fluoride. Then, by using an MOVPE method, the buffer layer 85 made of AlInP and a current blocking layer formation layer 86A made of AlGaAs are grown in this order on the p-type cladding layer 84.

Then, as illustrated in FIG. 13C, the current blocking layer formation layer 86A is etched until the buffer layer 85 is exposed, thus forming the current blocking layer 86 including the opening 86a having a shape conforming to the shape of the protrusion 84a.

Then, although not shown, the contact layer 87 is formed on the current blocking layer 86 and a portion of the buffer layer 85 that is exposed through the opening 86a by using an MOVPE method, after which the n-side electrode 88 and the p-side electrode 89 are formed on the lower surface of the substrate 81 and on the upper surface of the contact layer 87, respectively, thereby obtaining the semiconductor laser device of the sixth embodiment.

As described above, according to the sixth embodiment, the buffer layer 85 is formed between the p-type cladding layer 84 and the current blocking layer 86, whereby it is possible to form, with a reduced defect density, the current blocking layer 86 made of AlGaAs having a band gap that is transparent to light emitted from the active layer 83. Thus, in a case where the semiconductor laser device is designed so that laser light is distributed also above the p-type cladding layer 84, the loss of laser light in the current blocking layer 86 is reduced, whereby it is possible to reduce the threshold current and the operating current of the semiconductor laser device.

Variation of Sixth Embodiment

A semiconductor laser device according to one variation of the sixth embodiment will now be described with reference to the drawings. The present variation differs from the sixth embodiment in that no buffer layer is formed on the top surface of the protrusion 84a of the p-type cladding layer 84.

Figure 14:
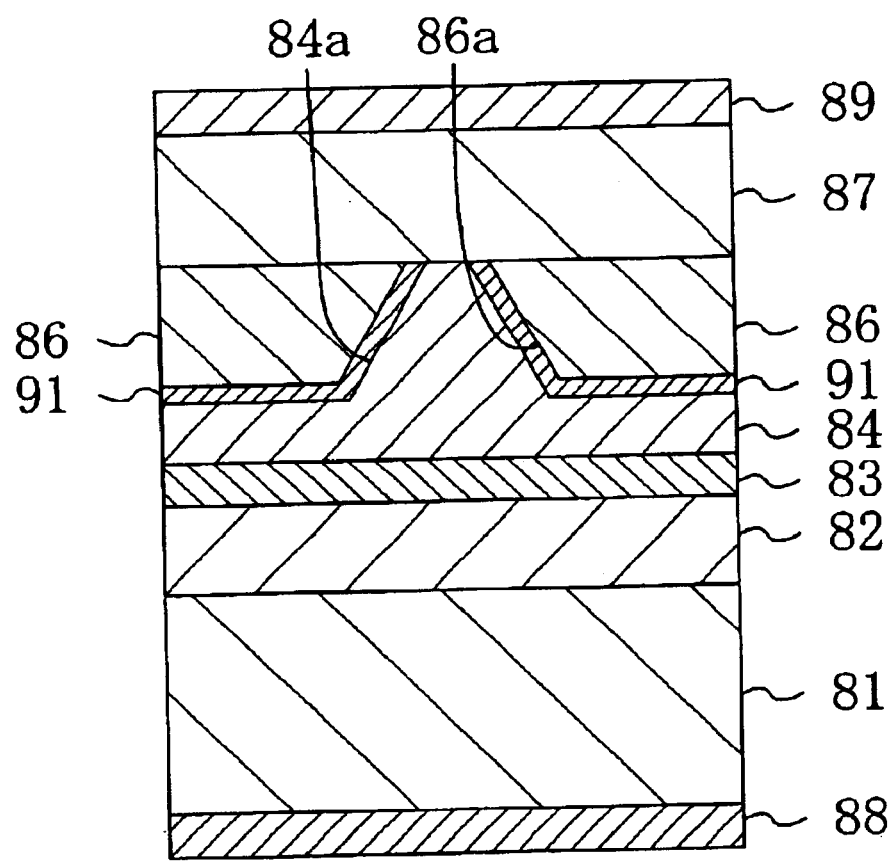
FIG. 14 is a cross-sectional view illustrating a semiconductor laser device according to a variation of the sixth embodiment of the present invention.

FIG. 14 is a cross-sectional view illustrating the semiconductor laser device according to the variation of the sixth embodiment. In FIG. 14, like components to those illustrated in FIG. 12 are denoted by like reference numerals and will not be further described below.

As illustrated in FIG. 14, in the semiconductor laser device of the present variation, the p-type cladding layer 84 includes the stripe-shaped protrusion 84a, and a buffer layer 91 made of p-type AlGaInP is formed on the wall surface of the protrusion 84a and on the surface at the foot of the protrusion 84a. The current blocking layer 86 made of n-type AlGaAs is formed on the buffer layer 91. The contact layer 87 made of p-type GaAs is formed on the current blocking layer 86 and on the top surface of the protrusion 84a of the p-type cladding layer 84.

Note that in the present variation, the buffer layer 91 is doped with a p-type impurity, and it thus functions as a part of the p-type cladding layer. Alternatively, it may be doped with an n-type impurity so that it functions as a part of the current blocking layer.

As described above, according to the variation of the sixth embodiment, the following effect can be obtained in addition to those of the sixth embodiment. That is, since the buffer layer 91 is not formed on the top surface of the protrusion 84a of the p-type cladding layer 84, the buffer layer 91 can function as a part of the current blocking layer by introducing an n-type impurity thereinto or as a part of the p-type cladding layer by introducing a p-type impurity thereinto.

Seventh Embodiment

A semiconductor laser device according to the seventh embodiment will now be described with reference to the drawings.

Figure 15:
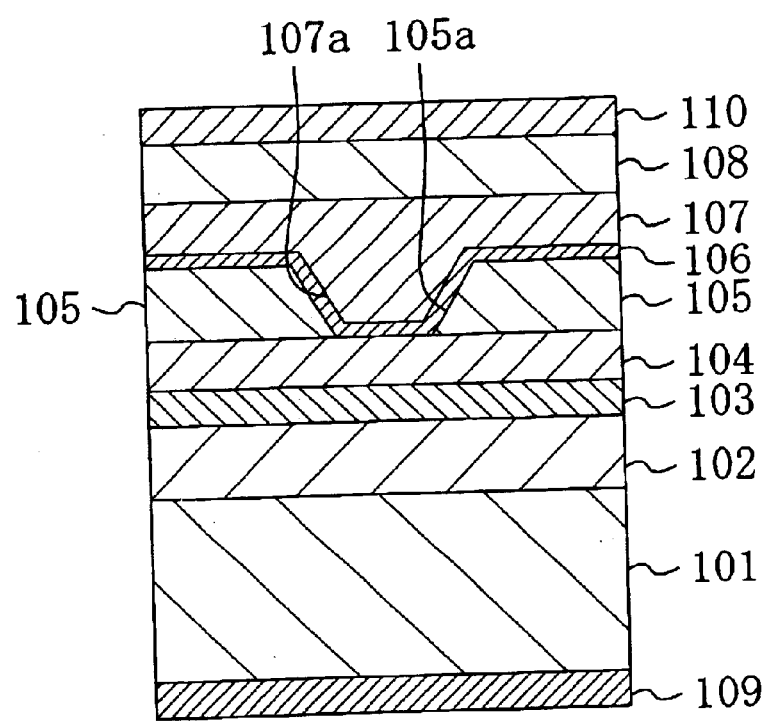
FIG. 15 is a cross-sectional view illustrating a semiconductor laser device according to a seventh embodiment of the present invention.

FIG. 15 is a cross-sectional view illustrating the semiconductor laser device according to the seventh embodiment of the present invention. As illustrated in FIG. 15, an n-type cladding layer 102 made of n-type AlGaInP, an active layer 103 including a multiple quantum well and optical guiding layers interposing the multiple quantum well therebetween, and a first p-type cladding layer 104 made of p-type AlGaInP, are deposited in this order on a substrate 101 made of n-type GaAs.

Note that in the active layer 103, the multiple quantum well has an alternating pattern of three well layers made of GaInP and two barrier layers made of AlGaInP, with two of the well layers being the outermost layers of the multiple quantum well, and an optical guiding layer made of AlGaInP is formed on the upper side and on the lower side of the multiple quantum well.

A current blocking layer 105 made of n-type AlGaInP and including a stripe-shaped opening 105a is formed on the first p-type cladding layer 104, and a buffer layer 106 made of AlGaInP is formed on the current blocking layer 105 and on a portion of the first p-type cladding layer 104 exposed through the opening 105a. A second p-type cladding layer 107 made of AlGaAs including a downward protrusion 107a is formed on the buffer layer 106. The protrusion 107a has a shape conforming to the shape of the opening 105a of the current blocking layer 105. A contact layer 108 made of p-type GaAs is formed on the second p-type cladding layer 107.

An n-side electrode 109 is formed under the substrate 101. The n-side electrode 109 is made of an alloy containing Au, Ge and Ni, for example, and is in ohmic contact with the substrate 101. Moreover, a p-side electrode 110 is formed on the contact layer 108. The p-side electrode 110 is made of an alloy containing Cr, Pt and Au, for example, and is in ohmic contact with the contact layer 108.

Herein, the structure is doped with Si as an n-type impurity and Zn as a p-type impurity. Moreover, the doping concentration is substantially equal to the carrier concentration at room temperature.

Among the semiconductor layers described above, the first p-type cladding layer 104 is made of $Al_{0.35}Ga_{0.15}In_{0.5}P$, the current blocking layer 105 is made of $Al_{0.45}Ga_{0.05}In_{0.5}P$, the buffer layer 106 is made of $Al_{0.5}In_{0.5}P$, and the second p-type cladding layer 107 is made of $Al_{0.8}Ga_{0.2}As$. The compositions of the other semiconductor layers may be the same as those of the third embodiment (Table 1 above).

In the semiconductor laser device of the seventh embodiment, the buffer layer 106 made of AlInP is formed between the current blocking layer 105 made of AlGaInP and the second p-type cladding layer 107 made of AlGaAs, and the Ga content in the buffer layer 106 is smaller than that in the current blocking layer 105. Thus, in the semiconductor laser device of the seventh embodiment, the layered structure including the current blocking layer 105, the buffer layer 106 and the second p-type cladding layer is similar to the group III-V compound semiconductor layered structure of the first embodiment.

Moreover, in the opening 105a of the current blocking layer 105, the buffer layer 106 is formed between the first p-type cladding layer 104 made of AlGaInP and the second p-type cladding layer 107, and the Ga content in the buffer layer 106 is smaller than that in the first p-type cladding layer 104. Thus, in the semiconductor laser device of the seventh embodiment, the layered structure including the first p-type cladding layer 104, the buffer layer 106 and the second p-type cladding layer 107 is also similar to the group III-V compound semiconductor layered structure of the first embodiment.

In the seventh embodiment, the In content, 1−x−y, in each semiconductor layer made of $Al_xGa_yIn_{1-x-y}P$ is set to be 0.5 for the lattice match with the substrate 101 made of GaAs. Note however that for the purpose of realizing a lattice match with the substrate 101 made of GaAs, the In content, 1−x−y, in each semiconductor layer made of $Al_xGa_yIn_{1-x-y}P$ is not limited to 0.5, but may alternatively be any other suitable value as long as it satisfies $0.45 \leq 1-x-y \leq 0.55$.

In the semiconductor laser device of the seventh embodiment, the active layer 103 has a multiple quantum well structure with a band gap corresponding to a wavelength of 650 nm. Therefore, as the current passes through the gap in the current blocking layer 105 and reaches the active layer 103, laser light is emitted with an oscillation wavelength of 650 nm.

The buffer layer 106 is doped with a p-type impurity, and it thus functions as a part of the p-type cladding layer.

The second p-type cladding layer 107 has a band gap such that it is transparent to light emitted from the active layer 103. Thus, in a case where the semiconductor laser device is designed so that laser light is distributed also above the first p-type cladding layer 104, the loss of laser light in second p-type cladding layer 107 is reduced, whereby it is possible to reduce the threshold current and the operating current of the semiconductor laser device.

Furthermore, the buffer layer 106 is formed between the current blocking layer 105 and the second p-type cladding layer 107. Herein, the current blocking layer 105 is made of $Al_{0.45}Ga_{0.05}In_{0.5}P$, and the buffer layer 106 is made of $Al_{0.5}In_{0.5}P$. Thus, the Ga content in the buffer layer 106 is smaller than that in the current blocking layer 105, whereby the crystal defect density at the interface between the buffer layer 106 and the second p-type cladding layer 107 can be reduced from that when the second p-type cladding layer 107 is formed directly on the current blocking layer 105.

Moreover, in the opening 105a of the current blocking layer 105, the buffer layer 106 is formed between the first p-type cladding layer 104 and the second p-type cladding layer 107. Herein, the first p-type cladding layer 104 is made of $Al_{0.35}Ga_{0.15}In_{0.5}P$, and the buffer layer 106 is made of $Al_{0.5}In_{0.5}P$. Thus, the Ga context in the buffer layer 106 is smaller than that in the first p-type cladding layer 104, whereby the crystal defect density at the interface between the buffer layer 106 and the second p-type cladding layer 107 can be reduced from that when the second p-type cladding layer 107 is formed; directly on the first p-type cladding layer 104.

Note that the compound composition of the buffer layer 106 is not limited to $Al_{0.5}In_{0.5}P$, but may alternatively be any other suitable composition as long as it is AlGaInP whose Ga content is smaller than that in the current blocking layer 105. Moreover, it is not necessary that the buffer layer 106 is formed directly on the current blocking layer 105. For example, the buffer layer 106 may be made of $Al_{0.45}Ga_{0.05}In_{0.5}P$, while a semiconductor layer made of $Al_{0.5}In_{0.5}P$, for example, may be inserted between the current blocking layer 105 and the buffer layer 106, and it is still possible to obtain the effect of reducing the crystal defect density at the interface between the buffer layer 106 and the second p-type cladding layer 107.

Next, a method for manufacturing the semiconductor laser device of the seventh embodiment having such a structure will now be described with reference to the drawings.

Figure 16A:
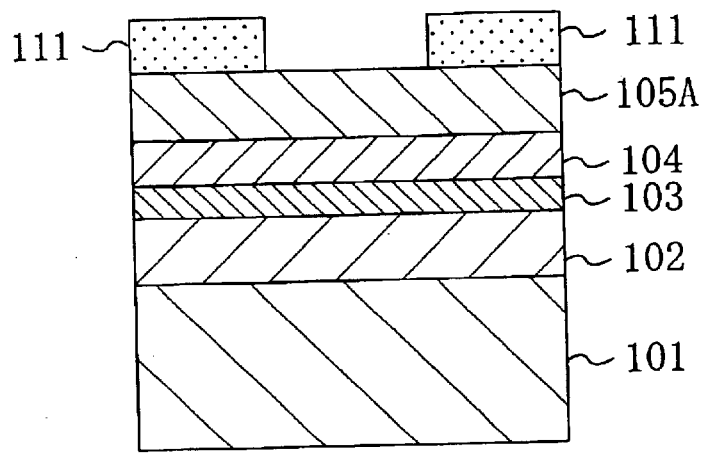
FIG. 16A to FIG. 16C are cross-sectional views sequentially illustrating steps in a method for manufacturing a semiconductor laser device according to the seventh embodiment of the present invention.
Figure 16B:
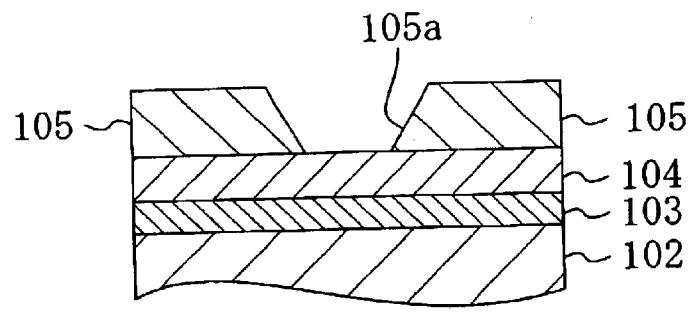
Figure 16C:
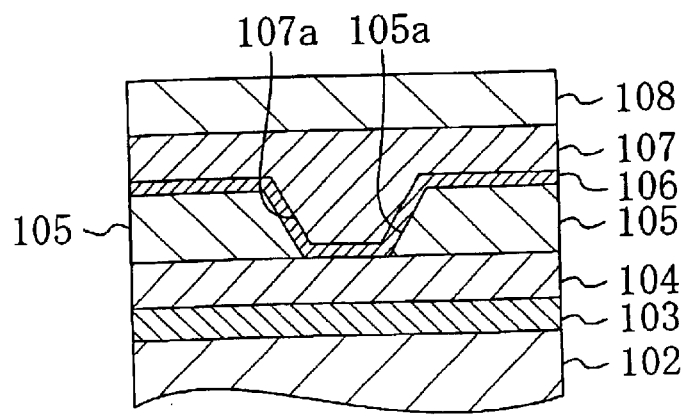

FIG. 16A to FIG. 16C are cross-sectional views sequentially illustrating steps in a method for manufacturing a semiconductor laser device according to the seventh embodiment. Note that a portion of the structure below the active layer 103 is omitted in FIG. 16B and FIG. 16C, because it is as illustrated in FIG. 16A.

First, as illustrated in FIG. 16A, the n-type cladding layer 102 made of n-type AlGaInP, the active layer 103, the first p-type cladding layer 104 made of p-type AlGaInP, and a current blocking layer formation layer 105A made of n-type AlGaInP, are grown in this order on the substrate 101 made of n-type GaAs by using an MOVPE method. Then, a resist mask 111 with a stripe-shaped opening patterned therein is formed on the current blocking layer formation layer 105A by using a photolithography method.

Herein, the active layer 103 is obtained by successively growing the component layers thereof so that a plurality of well layers made of GaInP and a plurality of barrier layers made of AlGaInP are deposited in an alternating pattern between two optical guiding layers made of AlGaInP.

Then, as illustrated in FIG. 16B, the current blocking layer formation layer 105A is etched while using the resist mask 111 as a mask to form the current blocking layer 105 including the stripe-shaped opening 105a, and the resist mask 111 is removed by using acetone.

Then, as illustrated in FIG. 16C, the buffer layer 106 made of AlInP, the second p-type cladding layer 107 made of AlGaAs, and the contact layer 108 made of p-type GaAs, are grown in this order on the current blocking layer 105 by using an MOVPE method.

Then, although not shown, the n-side electrode 109 and the p-side electrode 110 are formed on the lower surface of the substrate 101 and on the upper surface of the contact layer 108, respectively, thereby obtaining the semiconductor laser device of the seventh embodiment.

As described above, according to the seventh embodiment, the buffer layer 106 is formed between the first p-type cladding layer 104 and the second p-type cladding layer 107 and between the current blocking layer 105 and the second p-type cladding layer 107, whereby it is possible to form, with a reduced defect density, the second p-type cladding layer 107 made of AlGaAs having a band gap that is transparent to light emitted from the active layer 103. Thus, in a case where the semiconductor laser device is designed so that laser light is distributed also above the first p-type cladding layer 104, the loss of light in the second p-type cladding layer 107 is reduced, whereby it is possible to reduce the threshold current and the operating current of the semiconductor laser device.

Eighth Embodiment

A semiconductor laser device according to the eighth embodiment will now be described with reference to the drawings.

Figure 17:
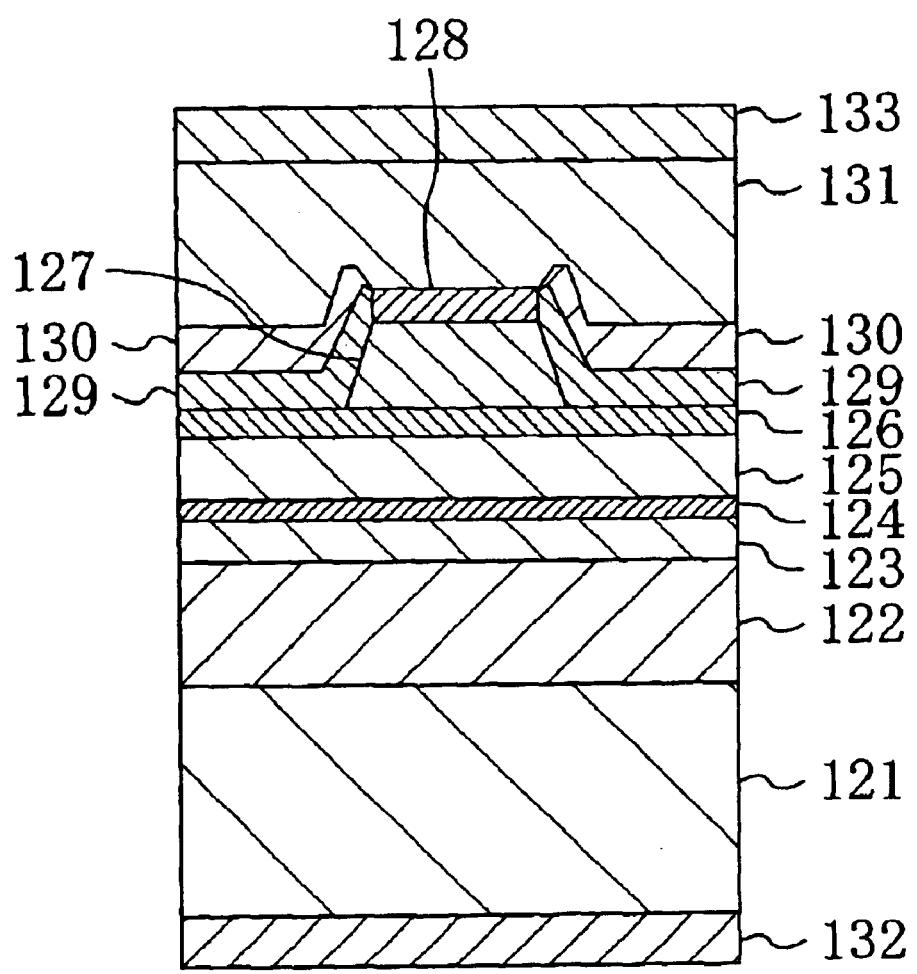
FIG. 17 is a cross-sectional view illustrating a semiconductor laser device according to an eighth embodiment of the present invention.

FIG. 17 is a cross-sectional view illustrating the semiconductor laser device according to the eighth embodiment of the present invention. As illustrated in FIG. 17, an n-type cladding layer 122 made of n-type AlGaInP, an active layer 123 including a multiple quantum well and optical guiding layers interposing the multiple quantum well therebetween, a first buffer layer 124 made of p-type AlGaInP, a first p-type cladding layer 125 made of p-type AlGaAs, and an etching stop layer 126 made of p-type AlGaInP, are deposited in this order on a substrate 121 made of n-type GaAs.

Note that in the active layer 123, the multiple quantum well has an alternating pattern of three well layers made of GaInP and two barrier layers made of AlGaInP, with two of the well layers being the outermost layers of the multiple quantum well, and an optical guiding layer made of AlGaInP is formed on the upper side and on the lower side of the multiple quantum well.

A second p-type cladding layer 127 made of p-type AlGaInP is formed in a stripe shape on the etching stop layer 126, and a first contact layer 128 made of p-type GaInP is formed on the second p-type cladding layer 127. Moreover, a first current blocking layer 129 made of n-type AlInP and a second current blocking layer 130 made of n-type GaAs are formed in this order on the upper surface of the etching stop layer 126 beside the second p-type cladding layer 127 and on the side surface of the second p-type cladding layer 127. Moreover, a second contact layer 131 made of p-type GaAs is formed on the first contact layer 128 and the second current blocking layer 130.

An n-side electrode 132 is formed under the substrate 121. The n-side electrode 132 is made of an alloy containing Au, Ge and Ni, for example, and is in ohmic contact with the substrate 121. Moreover, a p-side electrode 133 is formed on the second contact layer 131. The p-side electrode 133 is made of an alloy containing Cr, Pt and Au, for example, and is in ohmic contact with the second contact layer 131.

Herein, the structure is doped with Si as an n-type impurity and Zn as a p-type impurity. Moreover, the doping concentration is substantially equal to the carrier concentration at room temperature.

Table 4 below shows, as an example, the specific thickness, compound composition and doping concentration of each of the semiconductor layers.

TABLE 4

| Semiconductor layer | Thickness | Compound Composition | Doping | concentration (cm$^{-3}$) |
|---|---|---|---|---|
| Second contact layer | 3 nm | GaAs | p-type | $2 \times 10^{18}$ |
| Second current blocking layer | 0.2 µm | GaAs | n-type | $1 \times 10^{18}$ |
| First current blocking layer | 0.3 µm | $Al_{0.5}In_{0.5}P$ | n-type | $1 \times 10^{18}$ |
| First contact layer | 50 nm | $Ga_{0.5}In_{0.5}P$ | p-type | $1 \times 10^{18}$ |
| Second p-type cladding layer | 1.0 µm | $Al_{0.8}Ga_{0.2}As$ | p-type | $1 \times 10^{18}$ |
| Etching stop layer | 10 nm | $Al_{0.5}In_{0.5}P$ | p-type | $1 \times 10^{18}$ |
| First p-type cladding layer | 0.2 µm | $Al_{0.8}Ga_{0.2}As$ | p-type | $5 \times 10^{17}$ |
| First buffer layer | 1.0 nm | $Al_{0.5}In_{0.5}P$ | — | — |
| Active layer Multiple quantum well | | | | |
| Well layers | 6 nm each | $Ga_{0.5}In_{0.5}P$ | — | — |
| Barrier layers | 5 nm each | $Al_{0.25}Ga_{0.25}In_{0.5}P$ | — | — |
| Optical guiding layers | 20 nm each | $Al_{0.25}Ga_{0.25}In_{0.5}P$ | — | — |
| N-type cladding layer | 2.0 µm | $Al_{0.35}Ga_{0.15}In_{0.5}P$ | n-type | $1 \times 10^{18}$ |
| Substrate | 100 µm | GaAs | n-type | $1 \times 10^{18}$ |

As shown in Table 4 above, the Ga content in the first buffer layer 124 is smaller than that in the optical guiding layer that is the uppermost layer of the active layer 123. Thus, in the semiconductor laser device of the eighth embodiment, the layered structure including the optical guiding layer, the first buffer layer 124 and the first p-type cladding layer 125, which are deposited in this order, is similar to the group III-V compound semiconductor layered structure of the first embodiment.

Furthermore, the Ga content of the etching stop layer 126 is zero, so that in the layered structure in which the second p-type cladding layer 127 made of AlGaAs is deposited on the etching stop layer 126 made of AlGaInP, the Ga content of the semiconductor layer made of AlGaInP is relatively small.

Moreover, in the eighth embodiment, the In content, 1−x−y, in each semiconductor layer made of $Al_xGa_yIn_{1-x-y}P$ is set to be 0.5 for the lattice match with the substrate 121 made of GaAs. Note however that for the purpose of realizing a lattice match with the substrate 121 made of GaAs, the In content, 1−x−y, in each semiconductor layer made of $Al_xGa_yIn_{1-x-y}P$ is not limited to 0.5, but may alternatively be any other suitable value as long as it satisfies $0.45 \leq 1-x-y \leq 0.55$.

In the semiconductor laser device of the eighth embodiment, the active layer 123 has a multiple quantum well structure with a band gap corresponding to a wavelength of 650 nm. Therefore, as the current passes through the gap in the first current blocking layer 129 and the second current blocking layer 130 and reaches the active layer 123, laser light is emitted with an oscillation wavelength of 650 nm.

Herein, in the semiconductor laser device of the eighth embodiment, an AlGaAs-based semiconductor material, which has a high thermal conductivity, is used for the first p-type cladding layer 125 and the second p-type cladding layer 127. Therefore, the active layer 123 can be connected to a heat sink (not shown) via at least the first p-type cladding layer 125 and the second p-type cladding layer 127 so that heat generated in the active layer 123 can be efficiently radiated into the heat sink to suppress the increase in the temperature of the active layer 123. In this way, even if the current value is increased in order to increase the output power of the device, the light-emitting efficiency does not decrease due to thermal saturation Thus, it is possible to increase the output power of the semiconductor laser device.

Furthermore, the Ga content in the first buffer layer 124 is smaller than that of the optical guiding layer that is the uppermost layer of the active layer 123, and the Ga content of the etching stop layer 126 is set to a relatively small value, whereby it is possible to reduce the crystal defect density at the interface between the first buffer layer 124 and the first p-type cladding layer 125 and at the interface between the etching stop layer 126 and the second p-type cladding layer 127.

Specifically, when the first p-type cladding layer 125 is formed directly on the active layer 123 without using the first buffer layer 124, the crystal defect density is $1 \times 10^6/cm^2$ or more. In contrast, in the eighth embodiment, the number of crystal defects per square centimeter at the interface between the first buffer layer 124 and the first p-type cladding layer 125 is on the order of 10, indicating that the device performance is improved through the reduction of the crystal defect density.

Moreover, $Al_{0.5}In_{0.5}P$ is used for the etching stop layer 126, whereby the number of crystal defects per square centimeter at the interface between the etching stop layer 126 and the second p-type cladding layer 127 is on the order of 10.

Note that in the eighth embodiment, the compound composition of the first buffer layer 124 is not limited to $Al_{0.5}In_{0.5}P$, but may alternatively be any other suitable composition as long as it is AlGaInP whose Ga content is smaller than that in the optical guiding layer that is the uppermost layer of the active layer 123. For example, if the Ga content is 0.15 or less, the crystal defect density at the interface between the first buffer layer 124 and the first p-type cladding layer 125 is as low as about $1 \times 10^5/cm^2$ or less.

Moreover, the thickness of the first buffer layer 124 is not limited to about 1 nm. As long as it is 0.5 nm or more and 5 nm or less, it is possible to obtain the effect of reducing the crystal defect density without influencing the characteristics of the semiconductor laser device.

Moreover, the compound composition of the etching stop layer 126 is not limited to $Al_{0.5}In_{0.5}P$, but may alternatively be any other suitable composition as long as it is AlGaInP whose Ga content is relatively small. For example, with $Al_{0.35}Ga_{0.15}In_{0.5}P$, the crystal defect density at the interface between the etching stop layer 126 and the second p-type cladding layer 127 is as low as about $1 \times 10^5/cm^2$ or less.

Next, a method for manufacturing the semiconductor laser device of the eighth embodiment having such a structure will now be described with reference to the drawings.

Figure 18A:
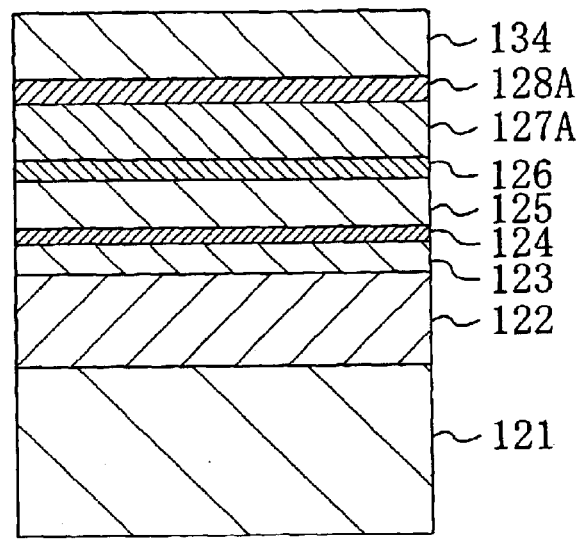
FIG. 18A to FIG. 18C are cross-sectional views sequentially illustrating steps in a method for manufacturing a semiconductor laser device according to the eighth embodiment of the present invention.
Figure 18B:
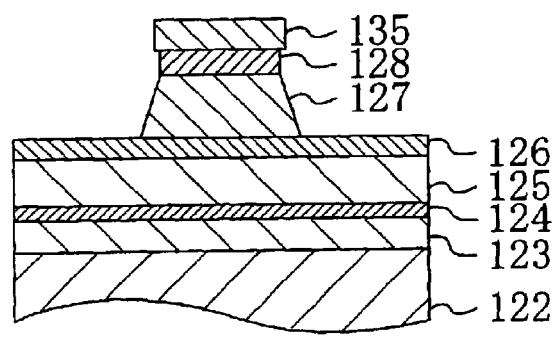
Figure 18C:
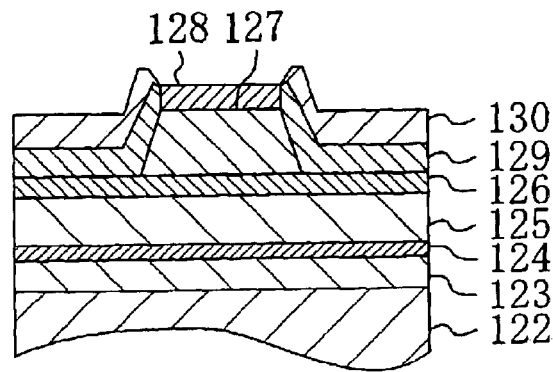

FIG. 18A to FIG. 18C are cross-sectional views sequentially illustrating steps in a method for manufacturing a semiconductor laser device according to the eighth embodiment. Note that a portion of the structure below the active layer 123 is omitted in FIG. 18B and FIG. 18C, because it is as illustrated in FIG. 18A.

First, as illustrated in FIG. 18A, the n-type cladding layer 122 made of n-type AlGaInP, the active layer 123, the first buffer layer 124 made of p-type AlGaInP, the first p-type cladding layer 125 made of p-type AlGaAs, the etching stop layer 126 made of p-type AlGaInP, a second p-type cladding layer formation layer 127A made of p-type AlGaAs, a first contact layer formation layer 128A made of p-type GaInP, and a protection layer 134 made of GaAs, are deposited in this order on the substrate 121 made of n-type GaAs by using an MOCVD method or an MBE method, for example.

Herein, the active layer 123 is obtained by successively growing the component layers thereof so that a plurality of well layers made of GaInP and a plurality of barrier layers made of AlGaInP are deposited in an alternating pattern between two optical guiding layers made of AlGaInP.

Then, as illustrated in FIG. 18B, the protection layer 134 is removed, after which a silicon oxide film 135 is deposited on the first contact layer formation layer 128A by using a CVD method, for example, and the deposited silicon oxide film 135 is patterned into a stripe shape by using a photolithography method and an etching method. Then, while using the patterned silicon oxide film 135 as a mask, the first contact layer formation layer 128A and the second p-type cladding layer formation layer 127A are successively etched to form the first contact layer 128 and the second p-type cladding layer 127, respectively, which are stripe-shaped.

Note that the silicon oxide film 135 can be patterned by using hydrogen fluoride, for example. Moreover, the first contact layer formation layer 128A may be etched by using a hydrochloric acid-type etchant. In this way, the first contact layer formation layer 128A can be etched selectively with respect to the second p-type cladding layer formation layer 127A.

Moreover, the second p-type cladding layer formation layer 127A may be etched by using an etchant that has a high selectivity ratio for AlGaAs with respect to AlGaInP, e.g., a mixture of ammonia and hydrogen peroxide. In this way, the etching process substantially stops at the etching stop layer 126 made of AlGaInP, whereby the second p-type cladding layer 127 can be processed with a good controllability.

Herein, in a case where an AlGaAs-based semiconductor material is used for the etching stop layer 126, it is necessary to ensure some etching selectivity ratio by giving a substantial difference between the Al content of the second p-type cladding layer 127 and that of the etching stop layer 126. However, when the Al content of an AlGaAs-based semiconductor material is small, it is not possible to ensure a band gap that is transparent to the oscillation wavelength of the active layer 123, and light emitted from the active layer 123 is absorbed, thereby causing loss of light. On the other hand, when the Al content in the etching stop layer 126 is set so that loss of light does not occur, it is not possible to ensure a sufficient Al content difference required for a selective etching process, whereby the etching process proceeds to the first p-type cladding layer 125 beyond the etching stop layer 126.

Thus, by using an AlGaInP-based semiconductor material for the etching stop layer 126, the second p-type cladding layer 127 can be processed into a stripe (ridge) shape with a good reproducibility and a high precision.

Then, as illustrated in FIG. 18C, the first current blocking layer 129 made of n-type AlInP and the second current blocking layer 130 made of n-type GaAs are grown in this order by using an MOCVD method or an MBE method, for example, after which the silicon oxide film 135 is lifted off so as to remove portions of the first current blocking layer 129 and the second current blocking layer 130 that are located above the first contact layer 128.

Then, although not shown, the second contact layer 131 made of p-type GaAs is grown on the first contact layer 128 and the second current blocking layer 130, after which the n-side electrode 132 and the p-side electrode 133 are formed on the lower surface of the substrate 121 and on the upper surface of the second contact layer 131, respectively, thereby obtaining the semiconductor laser device of the eighth embodiment.

As described above, according to the eighth embodiment, the first buffer layer 124 is provided between the optical guiding layer that is the outermost layer of the active layer 123 and the first p-type cladding layer 125, whereby the first p-type cladding layer 125 of AlGaAs can be formed, with a reduced crystal defect density, over the active layer 123 made of an AlGaInP-based semiconductor material. Thus, the first p-type cladding layer 125 and the second p-type cladding layer 127 can be provided with a high thermal conductivity, whereby heat generated in the active layer 123 can be efficiently radiated into the heat sink. Thus, it is possible to realize, with a reduced defect density, an increase in the output power of the semiconductor laser device. Specifically, the semiconductor laser device of the eighth embodiment is capable of operating at an output power as high as 120 mW without saturating its output power even at an environmental temperature of about 70° C.

Variation of Eighth Embodiment

One variation of the eighth embodiment will now be described with reference to the drawings.

Figure 19:
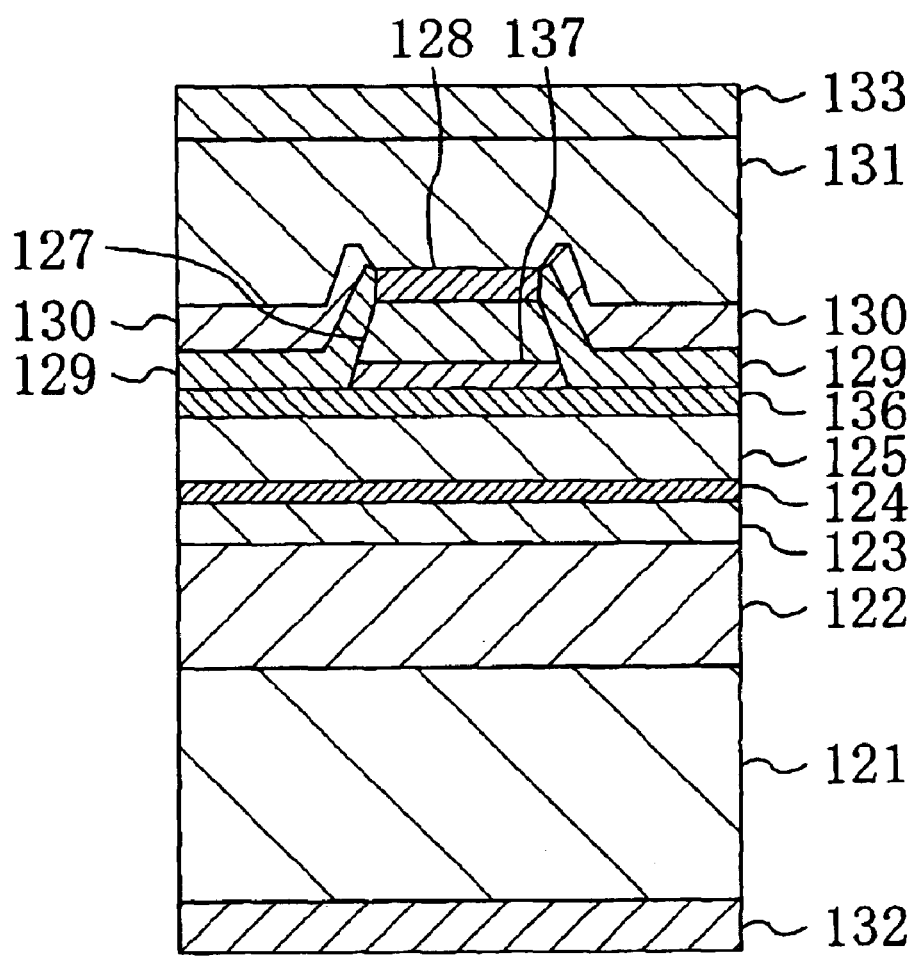
FIG. 19 is a cross-sectional view illustrating a semiconductor laser device according to a variation of the eighth embodiment of the present invention.

FIG. 19 is a cross-sectional view illustrating the semiconductor laser device according to the variation of the eighth embodiment. In FIG. 19, like components to those of the semiconductor laser device of the eighth embodiment illustrated in FIG. 17 are denoted by like reference numerals and will not be further described below.

As illustrated in FIG. 19, in the semiconductor laser device of the present variation, an etching stop layer 136 made of p-type $Ga_{0.5}In_{0.5}P$ having a thickness of about 50 nm is formed on the first p-type cladding layer 125, instead of the etching stop layer 126 made of p-type AlInP illustrated in FIG. 17, and a second buffer layer 137 made of p-type $Al_{0.5}In_{0.5}P$ having a thickness of about 1 nm is formed between the etching stop layer 136 and the second p-type cladding layer 127. Note that the compound composition, the thickness and the doping concentration of each of the semiconductor layers other than the etching stop layer 136 and the second buffer layer 137 are as shown in Table 4 above.

A feature of the present variation is that, in addition to the provision of the first buffer layer 124, whereby the first p-type cladding layer 125 made of AlGaAs can be formed with a reduced crystal defect density as in the eighth embodiment, the second buffer layer 137 is provided between the etching stop layer 136 and the second p-type cladding layer 127, whereby it is possible to reduce the crystal defect density at the interface with the second p-type cladding layer 127 even if the Ga content of the etching stop layer 136 is increased.

Note that the thickness of the second buffer layer 137 is not limited to about 1 nm, but may alternatively be any other suitable value as long as it is 0.5 nm or more and 5 nm or less, and it is still possible to obtain the effect of reducing the crystal defect density without influencing the characteristics of the semiconductor laser device.

Specifically, in a case where the first p-type cladding layer 125 is formed directly on the etching stop layer 136 without using the second buffer layer 137, since the etching stop layer 136 has a relatively large Ga content of 0.5, the crystal defect density is $1 \times 10^7 / cm^2$ or more. In contrast, in the present variation, the number of crystal defects per square centimeter at the interface between the second buffer layer 137 and the first p-type cladding layer 125 is on the order of 10, indicating that the device performance can be improved through the reduction of the crystal defect density.

Note that in the present variation, the compound composition of the second buffer layer 137 is not limited to $Al_{0.5}In_{0.5}P$, but may alternatively be any other suitable composition as long as it is AlGaInP whose Ga content is smaller than that in the etching stop layer 136. For example, when the Ga content is 0.15 or less, the crystal defect density at the interface between the second buffer layer 137 and the etching stop layer 136 is as low as $1 \times 10^5 / cm^2$ or less.

A method for manufacturing the semiconductor laser device of the present variation will now be described with reference to FIG. 18A to FIG. 18C.

First, as in the step illustrated in FIG. 18A, the n-type cladding layer 122, the active layer 123, the first buffer layer 124, the first p-type cladding layer 125, the etching stop layer 136 made of p-type GaInP, a second buffer layer formation layer made of p-type AlInP, the second p-type cladding layer formation layer 127A, the first contact layer formation layer 128A, and the protection layer 134, are grown in this order on the substrate 121.

Then, as in the step illustrated in FIG. 18B, the protection layer 134 is removed, after which the first contact layer formation layer 128A, the second p-type cladding layer formation layer 127A and the second buffer layer formation layer are successively etched while using the patterned silicon oxide film 135 as a mask to form the first contact layer 128, the second p-type cladding layer 127 and the second buffer layer 137, respectively, which are stripe-shaped.

Herein, the second buffer layer formation layer can be etched by using, for example, sulfuric acid as an etchant. In this way, it can be etched selectively with respect to the etching stop layer 136, whereby it is possible to form the second buffer layer 137 with a good controllability.

Then, as in the step illustrated in FIG. 18C, the first current blocking layer 129, the second current blocking layer 130 and the second contact layer 131 are grown in this order, after which the n-side electrode 132 and the p-side electrode 133 are formed, thereby obtaining the semiconductor laser device of the present variation.

The etching stop layer 126 of the eighth embodiment is made of AlInP and contains Al. Therefore, the etching stop layer 126, which has been exposed after etching the second p-type cladding layer 127, may be oxidized to deteriorate the crystallinity of the first current blocking layer 129 and the second current blocking layer 130, which are formed on the etching stop layer 126. In contrast, the etching stop layer 136 of the present variation is made of GaInP and does not contain Al. Therefore, it is possible to suppress the oxidization of the etching stop layer 136, which has been exposed after etching the second buffer layer 137, whereby it is possible to improve the crystalline quality of the first current blocking layer 129 and the second current blocking layer 130.

As described above, according to the variation of the eighth embodiment, a high output power can be obtained as in the eighth embodiment. In addition, the second buffer layer 137 is provided, whereby even if the Al content in the etching stop layer 136 is reduced, the crystal defect density at the interface between the etching stop layer 136 and the second p-type cladding layer 127 does not increase. In this way, the oxidization of the etching stop layer 136 during the manufacturing process is suppressed, thereby improving the crystalline quality of the first current blocking layer 129 and the second current blocking layer 130 and improving the reliability of the semiconductor laser device as compared to that in the eighth embodiment.

Note that in the semiconductor laser devices of the eighth embodiment and the variation thereof, it is more preferred that n-type AlGaAs is used as the compound semiconductor of the n-type cladding layer 122. Thus, an AlGaAs-based semiconductor material, which has a high thermal conductivity, is used for the n-type cladding layer 122, in addition to the first p-type cladding layer 125 and the second p-type cladding layer 127, whereby heat generated in the active layer 123 is more effectively radiated, and the output power can be further increased.

Moreover, in the semiconductor laser devices of the eighth embodiment and the variation thereof, the material of the substrate 121 is not limited to n-type GaAs, but the substrate 121 may alternatively be a p-type substrate made of p-type GaAs, for example.

Moreover, in the semiconductor laser devices of the eighth embodiment and the variation thereof, a real refractive index waveguide is formed by using AlInP for the first current blocking layer 129. Alternatively, a complex refractive index waveguide may be formed by using GaAs for the first current blocking layer 129.

Moreover, in the semiconductor laser devices of the eighth embodiment and the variation thereof, the active layer 123 is not limited to those of a multiple quantum well structure, but may alternatively be an active layer of a single quantum well structure or a single bulk active layer, for example.

Moreover, in the semiconductor laser devices of the eighth embodiment and the variation thereof, the waveguide structure is not limited to a ridge-shaped waveguide structure, but may alternatively be any other suitable structure such as an internal stripe-shaped waveguide structure, and it is still possible to obtain similar effects.

Ninth Embodiment

A semiconductor laser device according to the ninth embodiment will now be described with reference to the drawings.

Figure 20:
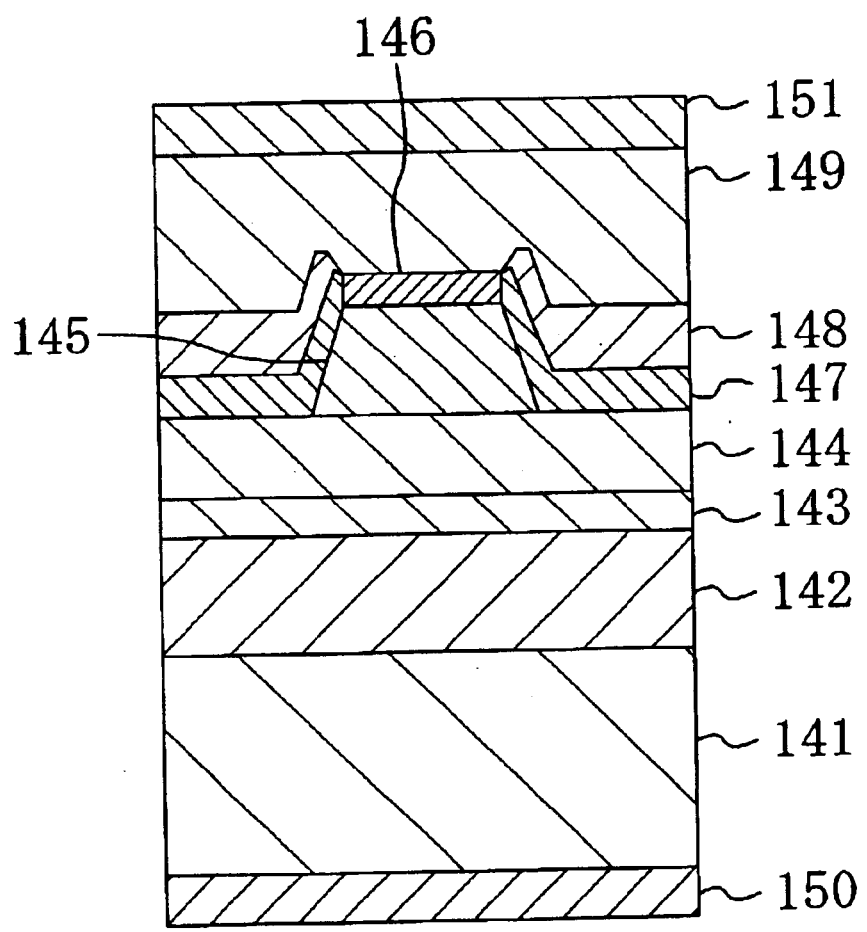
FIG. 20 is a cross-sectional view illustrating a semiconductor laser device according to a ninth embodiment of the present invention.

FIG. 20 is a cross-sectional view illustrating the semiconductor laser device according to the ninth embodiment of the present invention. As illustrated in FIG. 20, an n-type cladding layer 142 made of n-type AlGaInP, an active layer 143 of a multiple quantum well structure including a multiple quantum well and optical guiding layers interposing the multiple quantum well therebetween, and a first p-type cladding layer 144 made of p-type AlGaInP, are deposited in this order on a substrate 141 made of n-type GaAs.

Note that in the active layer 143, the multiple quantum well has an alternating pattern of three well layers made of GaInP and two barrier layers made of AlGaInP, with two of the well layers being the outermost layers of the multiple quantum well, and an optical guiding layer made of AlGaInP is formed on the upper side and on the lower side of the multiple quantum well.

A second p-type cladding layer 145 made of p-type AlGaAs is formed in a stripe shape on the first p-type cladding layer 144, and a first contact layer 146 made of p-type GaInP is formed on the second p-type cladding layer 145. Moreover, a first current blocking layer 147 made of p-type AlInP and a second current blocking layer 148 made of n-type GaAs are formed in this order on the upper surface of the first p-type cladding layer 144 beside the second p-type cladding layer 145 and on the side surface of the second p-type cladding layer 145. Moreover, a second contact layer 149 made of p-type GaAs is formed on the first contact layer 146 and the second current blocking layer 148.

Moreover, an n-side electrode 150 is formed under the substrate 141. The n-side electrode 150 is made of an alloy containing Au, Ge and Ni, for example, and is in ohmic contact with the substrate 141. Moreover, a p-side electrode 151 is formed on the second contact layer 149. The p-side electrode 151 is made of an alloy containing Cr, Pt and Au, for example, and is in ohmic contact with the second contact layer 149.

Herein, the structure is doped with Si as an n-type impurity and Zn as a p-type impurity. Moreover, the doping concentration is substantially equal to the carrier concentration at room temperature.

Table 5 below shows, as an example, the specific thickness, compound composition and doping concentration of each of the semiconductor layers.

TABLE 5

| Semiconductor layer | Thickness | Compound Composition | Doping | concentration (cm$^{-3}$) |
|---|---|---|---|---|
| Second contact layer | 3 μm | GaAs | p-type | $2 \times 10^{18}$ |
| Second current blocking layer | 0.2 μm | GaAs | n-type | $1 \times 10^{18}$ |
| First current blocking layer | 0.3 μm | Al$_{0.5}$In$_{0.5}$P | n-type | $1 \times 10^{18}$ |
| First contact layer | 50 nm | Ga$_{0.5}$In$_{0.5}$P | p-type | $1 \times 10^{18}$ |
| Second p-type cladding layer | 1 μm | Al$_{0.8}$Ga$_{0.2}$As | p-type | $1 \times 10^{18}$ |
| First p-type cladding layer | 0.2 μm | Al$_{0.4}$Ga$_{0.1}$In$_{0.5}$P | p-type | $5 \times 10^{17}$ |
| Active layer Multiple quantum well | | | | |
| Well layers | 6 nm each | Ga$_{0.5}$In$_{0.5}$P | — | — |
| Barrier layers | 5 nm each | Al$_{0.25}$Ga$_{0.25}$In$_{0.5}$P | — | — |
| Optical guiding layers | 20 nm each | Al$_{0.25}$Ga$_{0.25}$In$_{0.5}$P | — | — |
| N-type cladding layer | 2 μm | Al$_{0.35}$Ga$_{0.15}$In$_{0.5}$P | n-type | $1 \times 10^{18}$ |
| Substrate | 100 μm | GaAs | n-type | $1 \times 10^{18}$ |

As shown in Table 5 above, the Ga content in the first p-type cladding layer 144 is 0.1, so that in the layered structure in which the second p-type cladding layer 145 made of AlGaAs is deposited on the first p-type cladding layer 144 made of AlGaInP, the Ga content of the semiconductor layer made of AlGaInP is relatively small.

Moreover, in the ninth embodiment, the In content, 1−x−y, in each semiconductor layer made of Al$_x$Ga$_y$In$_{1-x-y}$P is set to be 0.5 for the lattice match with the substrate 141 made of GaAs. Note however that for the purpose of realizing a lattice match with the substrate 141 made of GaAs, the In content, 1−x−y, in each semiconductor layer made of Al$_x$Ga$_y$In$_{1-x-y}$P is not limited to 0.5, but may alternatively be any other suitable value as long as it satisfies $0.45 \leq 1-x-y \leq 0.55$.

As in the semiconductor laser device of the eighth embodiment, in the semiconductor laser device of the ninth embodiment, the active layer 143 has a multiple quantum well structure with a band gap corresponding to a wavelength of 650 nm. Therefore, as the current passes through the gap in the first current blocking layer 147 and the second current blocking layer 148 and reaches the active layer 143, laser light is emitted with an oscillation wavelength of 650 nm.

Herein, in the semiconductor laser device of the ninth embodiment, an AlGaAs-based semiconductor material, which has a high thermal conductivity, is used for the second p-type cladding layer 145. Therefore, heat generated in the active layer 143 can be efficiently radiated into a heat sink (not shown) to suppress the increase in the temperature of the active layer 143.

Moreover, since an AlGaInP-based semiconductor material having a large band gap is used for the first p-type cladding layer 144, it is possible to provide a large band gap difference between the active layer 143 and the first p-type cladding layer 144, whereby it is possible to suppress the overflow of electrons from the active layer 143 into the first p-type cladding layer 144.

Thus, by using an AlGaInP-based semiconductor material for the first p-type cladding layer 144, electrons injected into the active layer 143 efficiently contribute to the radiative recombination. Moreover, by using an AlGaAs-based semiconductor material for the second p-type cladding layer 145, heat generated in the active layer 143 can be radiated into the heat sink, thereby suppressing the temperature increase. In this way, even if the current value is increased in order to increase the output power of the device, the light-emitting efficiency does not decrease due to thermal saturation. Thus, it is possible to increase the output power of the semiconductor laser device. Specifically, the semiconductor laser device of the ninth embodiment is capable of operating at an output power as high as 120 mW without saturating its output power even at an environmental temperature of about 70° C.

Furthermore, in the layered structure in which the second p-type cladding layer 145 made of AlGaAs is deposited on the first p-type cladding layer 144 made of AlGaInP, the first p-type cladding layer 144 has a relatively small Ga content of 0.1, whereby it is possible to reduce the crystal defect density at the interface between the first p-type cladding layer 144 and the second p-type cladding layer 145. Specifically, the crystal defect density at the interface between the first p-type cladding layer 144 and the second p-type cladding layer 145 is $1 \times 10^4$/cm$^2$ or less, indicating that the device performance can be improved through the reduction of the crystal defect density.

As described above, in the semiconductor laser device of the ninth embodiment, the second p-type cladding layer 145 made of AlGaAs is provided on the first p-type cladding layer 144 made of AlGaInP in order to suppress the overflow of electrons from the active layer 143 into the first p-type cladding layer 144 and to increase the output power by efficiently radiating heat generated in the active layer 143, wherein the first p-type cladding layer 144 has a small Ga content, whereby it is possible to reduce the crystal defect density at the interface between the first p-type cladding layer 144 and the second p-type cladding layer 145.

First Variation of Ninth Embodiment

A semiconductor laser device according to the first variation of the ninth embodiment will now be described with reference to the drawings.

Figure 21:
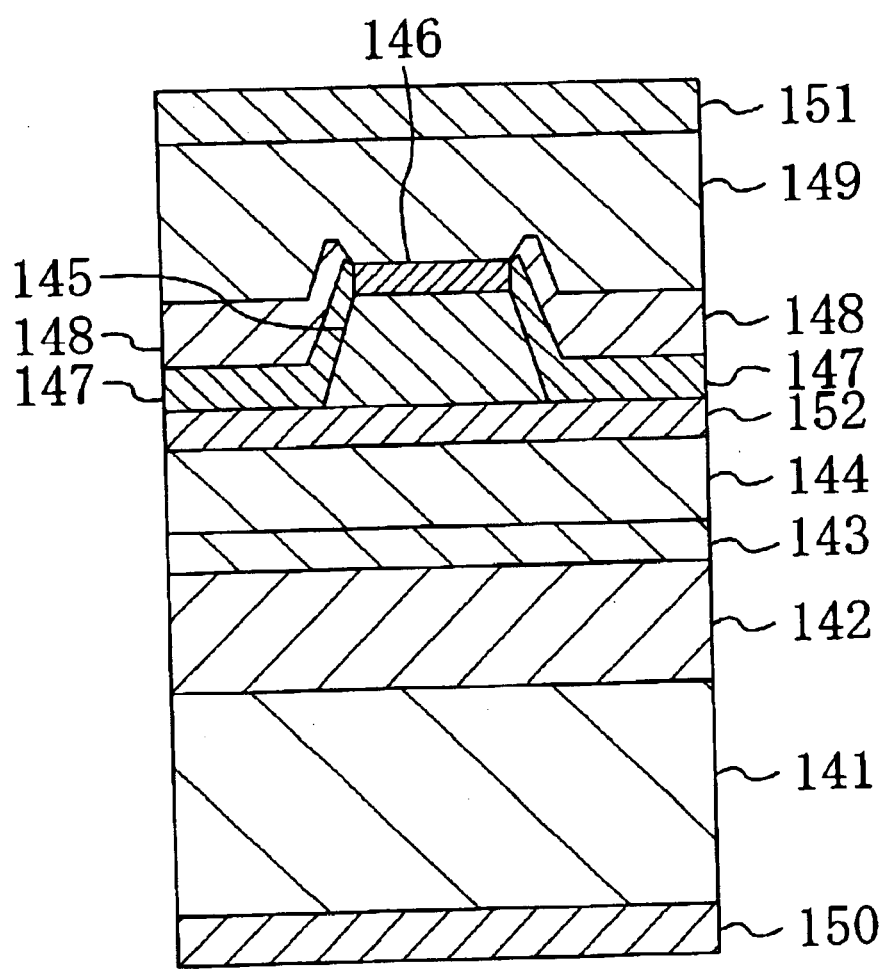
FIG. 21 is a cross-sectional view illustrating a semiconductor laser device according to a first variation of the ninth embodiment of the present invention.

FIG. 21 is a cross-sectional view illustrating a semiconductor laser device according to the first variation of the ninth embodiment. In FIG. 21, like components to those of the semiconductor laser device of the ninth embodiment illustrated in FIG. 20 are denoted by like reference numerals and will not be further described below.

As illustrated in FIG. 21, the semiconductor laser device of the present variation differs from the semiconductor laser device of the ninth embodiment in that a buffer layer 152 made of p-type Al$_{0.45}$Ga$_{0.05}$In$_{0.5}$P having a thickness of about 1 nm is provided between the first p-type cladding layer 144 and the second p-type cladding layer 145.

Herein, the Ga content in the buffer layer 152 is smaller than that in the first p-type cladding layer 144. Thus, in the semiconductor laser device of the present variation, the layered structure including the first p-type cladding layer 144, the buffer layer 152 and the second p-type cladding layer 145, which are deposited in this order, is similar to the group III-V compound semiconductor layered structure of the first embodiment. Therefore, it is possible to reduce the crystal defect density at the interface between the buffer layer 152 and the second p-type cladding layer 145 as compared to the semiconductor laser device of the ninth embodiment in which the second p-type cladding layer 145 is formed directly on the first p-type cladding layer 144.

Note that the thickness of the buffer layer 152 is not limited to about 1 nm, but may alternatively be any other suitable value as long as it is 0.5 nm or more and 5 nm or less, and it is still possible to obtain the effect of reducing the crystal defect density without influencing the characteristics of the semiconductor laser device.

Thus, in the semiconductor laser device of the present variation, the crystal defect density at the interface between the buffer layer 152 and the second p-type cladding layer 145 is determined by the compound composition of the buffer layer 152 and is not dependent on the compound composition of the first p-type cladding layer 144. Therefore, it is possible to ensure sufficient freedom in designing the compound composition of the first p-type cladding layer 144. Particularly, it is possible to reduce the crystal defect density without influencing the various characteristics of the semiconductor laser device such as the operating current and the divergence angle in the vertical direction, which are determined by the Al content of the cladding layer.

Second Variation of Ninth Embodiment

A semiconductor laser device according to the second variation of the ninth embodiment will now be described with reference to the drawings.

Figure 22:
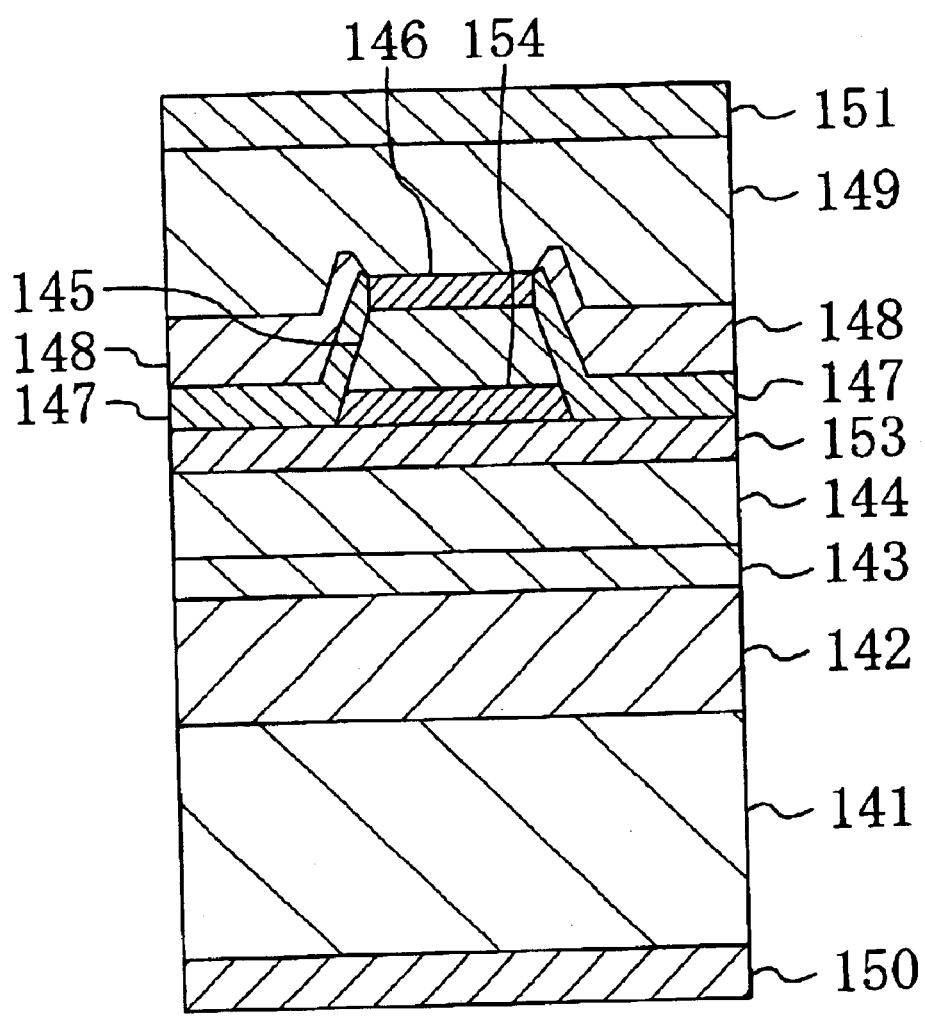
FIG. 22 is a cross-sectional view illustrating a semiconductor laser device according to a second variation of the ninth embodiment of the present invention.

FIG. 22 is a cross-sectional view illustrating the semiconductor laser device according to the second variation of the ninth embodiment. In FIG. 22, like components to those of the semiconductor laser device of the ninth embodiment illustrated in FIG. 20 are denoted by like reference numerals and will not be further described below.

As illustrated in FIG. 22, the semiconductor laser device of the present variation differs from the semiconductor laser device of the ninth embodiment in that an etching stop layer 153 made of $Ga_{0.5}In_{0.5}P$ having a thickness of about 10 nm is formed on the first p-type cladding layer 144, and a buffer layer 154 made of p-type $Al_{0.5}In_{0.5}P$ having a thickness of about 1 nm is provided between the etching stop layer 153 and the second p-type cladding layer 145.

Herein, the Ga content in the buffer layer 154 is smaller than that in the etching stop layer 153. Thus, in the semiconductor laser device of the present variation, the layered structure including the etching stop layer 153, the buffer layer 154 and the second p-type cladding layer 145, which are deposited in this order, is similar to the group III-V compound semiconductor layered structure of the first embodiment. Therefore, in a case where the etching stop layer 153 is made of GaInP, it is possible to reduce the crystal defect density at the interface between the buffer layer 154 and the second p-type cladding layer 145 as compared to a case where the second p-type cladding layer 145 is formed directly on the etching stop layer 153.

A method for manufacturing the semiconductor laser device of the present variation will now be described.

The semiconductor laser device of the present variation can be manufactured by a method similar to that for the semiconductor laser device of the eighth embodiment illustrated in FIG. 18A to FIG. 18C.

Specifically, the n-type cladding layer 142, the active layer 143, the first p-type cladding layer 144, the etching stop layer 153, a buffer layer formation layer made of p-type AlInP, a second p-type cladding layer formation layer made of p-type AlGaAs, and a first contact layer formation layer made of a p-type GaInP, are grown in this order on the substrate 141. Then, the first contact layer formation layer, the second p-type cladding layer formation layer and the buffer layer formation layer are selectively etched in this order while using a silicon oxide film that has been patterned into a stripe shape as a mask, thereby forming the first contact layer 146, the second p-type cladding layer 145 and the buffer layer 154, respectively. Then, the first current blocking layer 147, the second current blocking layer 148 and the second contact layer 149 are grown in this order, after which the n-side electrode 150 and the p-side electrode 151 are formed, thereby obtaining the semiconductor laser device of the present variation.

Note that the first contact layer formation layer made of GaInP can be etched by using a hydrochloric acid-type etchant. In this way, the first contact layer formation layer can be etched selectively with respect to the second p-type cladding layer formation layer made of AlGaAs. Similarly, the second p-type cladding layer formation layer can be etched by using a mixture of ammonia and hydrogen peroxide, or the like, and the buffer layer formation layer can be etched by using sulfuric acid, or the like. In this way, each of these layers can be etched selectively. Thus, it is possible to precisely form the buffer layer 154, the second p-type cladding layer 145 and the first p-type cladding layer, which are stripe-shaped.

Herein, although the etching stop layer 153 is exposed after forming the buffer layer 154 by etching, the etching stop layer 153 is made of GaInP and thus does not contain Al, whereby the oxidization of the etching stop layer 153 is suppressed, and it is possible to improve the crystalline quality of the first current blocking layer 147 and the second current blocking layer 148.

Thus, in the semiconductor laser device of the present variation, the etching stop layer 153 is provided between the first p-type cladding layer 144 and the second p-type cladding layer 145, and the Al content of the etching stop layer 153 is reduced, so as to prevent the etching stop layer 153 from being oxidized during the step of precisely forming the second p-type cladding layer 145, wherein the buffer layer 154 is provided between the etching stop layer 153 and the second p-type cladding layer 145. In this way, it is possible to reduce the crystal defect density in the second p-type cladding layer 145.

Note that in the semiconductor laser devices of the ninth embodiment and the variations thereof, it is preferred that the n-type cladding layer 142 is made of n-type AlGaAs. In this way, in addition to the second p-type cladding layer 145, the n-type cladding layer 142 is also made of an AlGaAs-based semiconductor material, which has a high thermal conductivity, whereby heat generated in the active layer 143 can be effectively radiated, allowing the output power to be further increased.

Moreover, in the semiconductor laser devices of the ninth embodiment and the variations thereof, the material of the substrate 141 is not limited to n-type GaAs, but the substrate 141 may alternatively be a p-type substrate made of p-type GaAs, for example.

Moreover, in the semiconductor laser devices of the ninth embodiment and the variations thereof, a real refractive index waveguide is formed by using AlInP for the first current blocking layer 147. Alternatively, a complex refractive index waveguide may be formed by using GaAs for the first current blocking layer 147.

Moreover, in the semiconductor laser devices of the ninth embodiment and the variations thereof, the active layer 143 is not limited to those of a multiple quantum well structure, but may alternatively be an active layer of a single quantum well structure or a single bulk active layer, for example.

Moreover, in the semiconductor laser devices of the ninth embodiment and the variations thereof, the waveguide structure is not limited to a ridge-shaped waveguide structure, but may alternatively be any other suitable structure such as an internal stripe-shaped waveguide structure, and it is still possible to obtain similar effects.

Tenth Embodiment

A semiconductor device according to the tenth embodiment will now be described with reference to the drawings.

Figure 23:
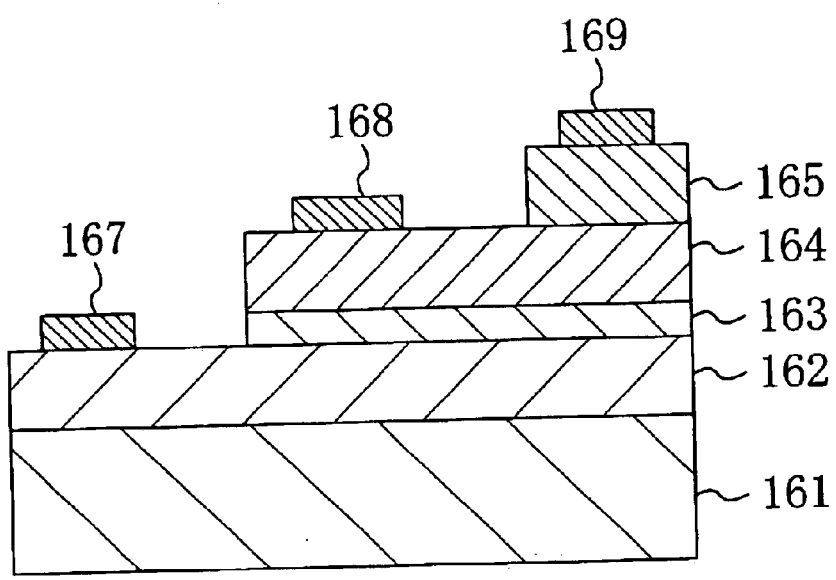
FIG. 23 is a cross-sectional view illustrating a semiconductor laser device according to a tenth embodiment of the present invention.

FIG. 23 is a cross-sectional view illustrating the semiconductor device according to the tenth embodiment. As illustrated in FIG. 23, the semiconductor device of the tenth embodiment is a heterojunction bipolar transistor (HBT), in which a collector layer 162 made of n-type AlGaInP, a buffer layer 163 made of n-type AlGaInP, a base layer 164 made of p-type AlGaAs, and an emitter layer 165 made of n-type AlGaAs, are deposited in this order on a substrate 161 made of undoped GaAs.

The collector layer 162, the base layer 164 and the emitter layer 165 are formed in a stair shape so that at least a portion of the upper surface of each of these layers is exposed. A collector electrode 167 is formed on the exposed portion of the upper surface of the collector layer 162. Similarly, a base electrode 168 and an emitter electrode 169 are formed on the base layer 164 and the emitter layer 165, respectively.

Herein, the collector layer 162, the buffer layer 163 and the emitter layer 165 are doped with Si as an n-type impurity, and the base layer 164 is doped with Zn as a p-type impurity.

Table 6 below shows, as an example, the specific thickness, compound composition and doping concentration of each of the semiconductor layers.

TABLE 6

| Semiconductor layer | Thickness | Compound Composition | Doping concentration (cm$^{-3}$) |
|---|---|---|---|
| Emitter layer | 0.5 μm | $Al_{0.5}Ga_{0.5}As$ | n-type 1 × 10$^{18}$ |
| Base layer | 0.5 μm | $Al_{0.2}Ga_{0.8}As$ | p-type 3 × 10$^{17}$ |
| Buffer layer | 1 nm | $Al_{0.25}Ga_{0.25}In_{0.5}P$ | n-type 1 × 10$^{18}$ |
| Collector layer | 1 μm | $Al_{0.35}Ga_{0.15}In_{0.5}P$ | n-type 1 × 10$^{18}$ |
| Substrate | 100 μm | GaAs | — |

As shown in Table 6 above, the Ga content in the buffer layer 163 is smaller than that in the collector layer 162. Thus, in the semiconductor device of the tenth embodiment, the layered structure including the collector layer 162, the buffer layer 163 and the base layer 164, which are deposited in this order, is similar to the group III-V compound semiconductor layered structure of the first embodiment.

In the tenth embodiment, the buffer layer 163 is provided, whereby as compared to a case where the base layer 164 is formed directly on the collector layer 162, the crystal defect density in the base layer 164 can be reduced, thus improving the current characteristic of the HBT.

Eleventh Embodiment

A semiconductor device according to the eleventh embodiment will now be described with reference to the drawings.

Figure 24:
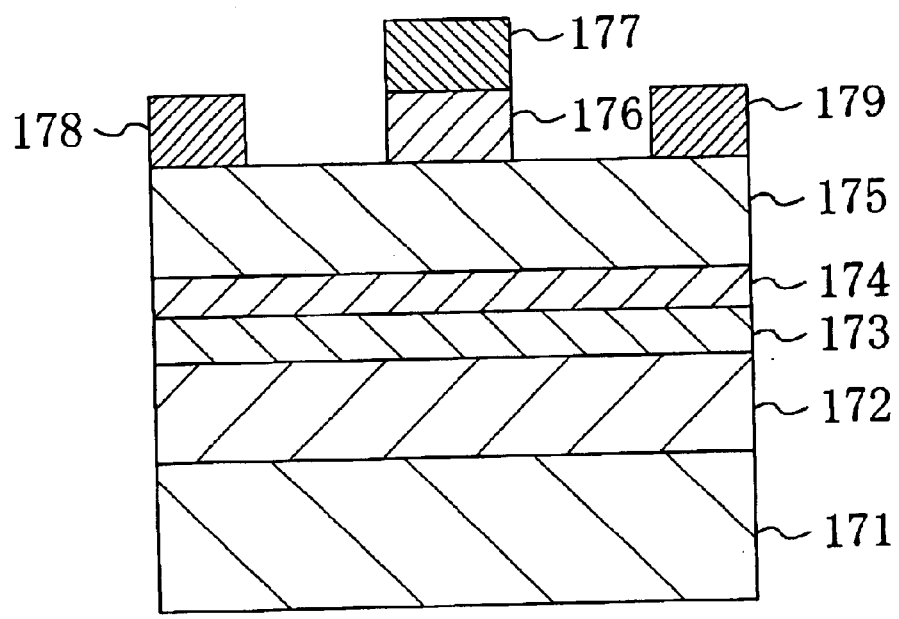
FIG. 24 is a cross-sectional view illustrating a semiconductor laser device according to an eleventh embodiment of the present invention.
Figure 25:
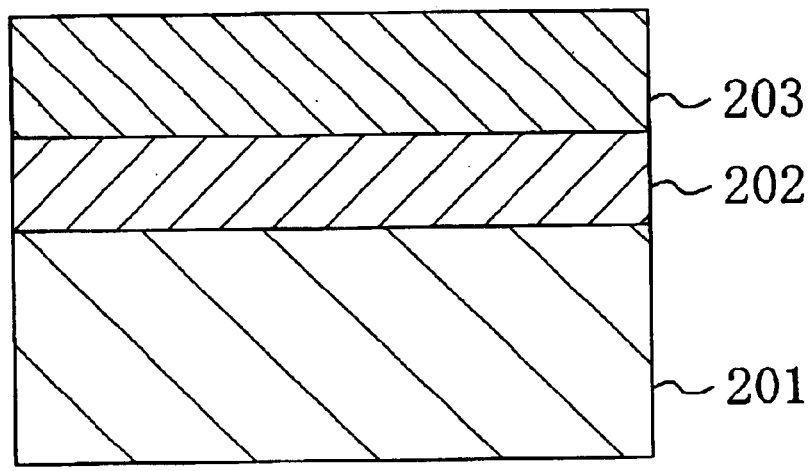
FIG. 25 is a cross-sectional view illustrating a conventional group III-V compound semiconductor.

FIG. 24 is a cross-sectional view illustrating the semiconductor device according to the eleventh embodiment. As illustrated in FIG. 24, the semiconductor device of the eleventh embodiment is a field effect transistor (FET), in which a blocking layer 172 made of undoped AlGaInP, a buffer layer 173 made of undoped AlGaInP, a channel layer 174 made of n-type AlGaAs, and a current supply layer 175 made of n-type AlGaAs, are deposited in this order on a substrate 171 made of undoped GaAs.

A gate electrode 177 is formed on the current supply layer 175 via a gate insulating film 176 therebetween, and a source electrode 178 and a drain electrode 179 are formed so as to be in ohmic contact with the current supply layer 175.

Table 7 below shows, as an example, the specific thickness, compound composition and doping concentration of each of the semiconductor layers.

TABLE 7

| Semiconductor layer | Thickness | Compound Composition | Doping concentration (cm$^{-3}$) |
|---|---|---|---|
| Electron supply layer | 0.5 μm | $Al_{0.5}Ga_{0.5}As$ | n-type 1 × 10$^{18}$ |
| Channel layer | 0.5 μm | $Al_{0.2}Ga_{0.8}As$ | n-type 1 × 10$^{18}$ |
| Buffer layer | 1 nm | $Al_{0.25}Ga_{0.25}In_{0.5}P$ | — |
| Blocking layer | 1 μm | $Al_{0.35}Ga_{0.15}In_{0.5}P$ | — |
| Substrate | 100 μm | GaAs | — |

As shown in Table 7 above, the Ga content in the buffer layer 173 is smaller than that in the blocking layer 172. Thus, in the semiconductor device of the eleventh embodiment, the layered structure including the blocking layer 172, the buffer layer 173 and the channel layer 174, which are deposited in this order, is similar to the group III-V compound semiconductor layered structure of the first embodiment.

According to the eleventh embodiment, the buffer layer 173 is provided, whereby as compared to a case where the channel layer 174 is formed directly on the blocking layer 172, the crystallinity of the channel layer 174 is improved. Thus, as compared to a case where the channel layer 174 is formed directly on the blocking layer 172, the crystal defect density in the channel layer 174 can be reduced, whereby a two-dimensional electron gas can be more easily formed at the interface with the channel layer, thus improving the high frequency characteristic of the FET.

As described above, in the method for manufacturing a group III-V compound semiconductor device of the present invention, a second semiconductor layer made of AlGaAs is formed on a first semiconductor layer made of AlGaInP, while the Ga content of the first semiconductor layer or the Al content of the second semiconductor layer is reduced, whereby it is possible to reduce the crystal defect density at the interface between the first semiconductor layer and the second semiconductor layer.

Moreover, without modifying the compound composition of the first semiconductor layer and that of the second semiconductor layer, a buffer layer made of AlGaInP whose Ga content is smaller than that of the first semiconductor layer or AlGaAs whose Al content is smaller than that of the second semiconductor layer may be formed between the first semiconductor layer and the second semiconductor layer, whereby it is possible to obtain a group III-V compound semiconductor layered structure with a reduced crystal defect density while obtaining substantially the same properties as those of a layered structure in which the second semiconductor layer is deposited directly on the first semiconductor layer. In this way, it is possible to improve the performance of various group III-V compound semiconductor devices as shown in the third to eleventh embodiments above.

What is claimed is:

1. A method for manufacturing a group III-V compound semiconductor device, comprising:

a first step of forming a first semiconductor layer made of $Al_aGa_bIn_{1-a-b}P$ (where $0 \leq a \leq 1$, $0 \leq b \leq 1$, $0 \leq a+b \leq 1$); and a second step of forming a second semiconductor layer made of $Al_cGa_{1-c}As$ (where $0 \leq c \leq 1$) directly on the first semiconductor layer, wherein in the first step, a Ga content b of the first semiconductor layer is 0.35 or less.

2. A group III-V compound semiconductor device, comprising:

a first semiconductor layer made of $Al_aGa_bIn_{1-a-b}P$ (where $0 \leq a \leq 1$, $0 \leq b \leq 1$, $0 \leq a+b \leq 1$); and a second semiconductor layer made of $Al_cGa_{1-c}As$ (where $0 \leq c \leq 1$) formed directly on the first semiconductor layer, wherein a Ga content b in the first semiconductor layer is 0.35 or less.

3. The group III-V compound semiconductor device of claim 2, further comprising:

a first cladding layer made of a compound semiconductor of a first conductivity type formed on a substrate;

an active layer formed on the first cladding layer; and a second cladding layer made of a compound semiconductor of a second conductivity type formed on the active layer, wherein the first semiconductor layer is formed in a stripe shape on the second cladding layer.

4. The group III-V compound semiconductor device of claim 3, further comprising:

a first contact layer made of $Al_dGa_{1-d}As$ (where $0 \leq d \leq 1$) of the second conductivity type formed on the second semiconductor layer; and a second contact layer made of GaAs of the second conductivity type formed on the first contact layer, wherein an Al content d in the first contact layer is larger than an Al content c in the second semiconductor layer.

5. The group III-V compound semiconductor device of claim 2, further comprising:

a first cladding layer made of a compound semiconductor of a first conductivity type formed on a substrate;

an active layer formed on the first cladding layer; and a second cladding layer made of a compound semiconductor of a second conductivity type formed on the active layer, wherein: the first semiconductor layer is provided on the second cladding layer; and the second semiconductor layer is formed in a stripe shape.

6. The group III-V compound semiconductor device of claim 5, wherein the second cladding layer is made of $Al_dGa_{1-d}As$ (where $0 \leq d \leq 1$) of the second conductivity type.

7. The group III-V compound semiconductor device of claim 5, wherein the first cladding layer is made of $Al_dGa_{1-d}As$ (where $0 \leq d \leq 1$) of the first conductivity type.

8. The group III-V compound semiconductor device of claim 2, further comprising:

a first cladding layer made of a compound semiconductor of a first conductivity type formed on a substrate; and an active layer formed on the first cladding layer, wherein the first semiconductor layer is provided on the active layer.

9. A method for manufacturing a group III-V compound semiconductor device, comprising:

a first step of forming a first semiconductor layer made of $Al_aGa_bIn_{1-a-b}P$ (where $0 \leq a \leq 1$, $0 \leq b \leq 1$, $0 \leq a+b \leq 1$); and a second step of forming a second semiconductor layer made of $Al_cGa_{1-c}As$ (where $0 \leq c \leq 1$) directly on the first semiconductor layer, wherein in the second step, an Al content c of the second semiconductor layer is 0.3 or less.

10. A group III-V compound semiconductor device, comprising:

a first semiconductor layer made of $Al_aGa_bIn_{1-a-b}P$ (where $0 \leq a \leq 1$, $0 \leq b \leq 1$, $0 \leq a+b \leq 1$); and a second semiconductor layer made of $Al_cGa_{1-c}As$ (where $0 \leq c \leq 1$) formed directly on the first semiconductor layer, wherein an Al content c in the second semiconductor layer is 0.3 or less.

* * * * *